United States Patent
Ito

(10) Patent No.: US 7,738,232 B2
(45) Date of Patent: Jun. 15, 2010

(54) ALIGNMENT APPARATUS

(75) Inventor: Hirohito Ito, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 1310 days.

(21) Appl. No.: 10/834,845

(22) Filed: Apr. 30, 2004

(65) Prior Publication Data

US 2005/0017831 A1    Jan. 27, 2005

(30) Foreign Application Priority Data

May 12, 2003   (JP) ................................ 2003-133535

(51) Int. Cl.
*H01H 47/00* (2006.01)
(52) U.S. Cl. .................................................. 361/152
(58) Field of Classification Search ................ 361/152; 355/75, 53, 72, 77, 78
See application file for complete search history.

(56) References Cited

U.S. PATENT DOCUMENTS

| | | | |
|---|---|---|---|
| 5,909,272 A | 6/1999 | Osanai et al. | 355/53 |
| 5,939,852 A | 8/1999 | Akutsu et al. | 318/640 |
| 6,008,882 A | 12/1999 | Ito et al. | 355/53 |
| 6,028,376 A | 2/2000 | Osanai et al. | 310/12 |
| 6,359,679 B1 | 3/2002 | Ito et al. | 355/75 |
| 6,570,645 B2 | 5/2003 | Korenaga et al. | 355/75 |
| 6,714,842 B1 | 3/2004 | Ito | 700/302 |
| 6,742,393 B2 | 6/2004 | Ito | 73/662 |
| 2002/0145721 A1 | 10/2002 | Korenaga et al. | 355/75 |
| 2003/0098966 A1 | 5/2003 | Korenaga et al. | 355/75 |

FOREIGN PATENT DOCUMENTS

| | | |
|---|---|---|
| JP | 60227163 A * | 11/1985 |
| JP | 5-302641 | 11/1993 |
| JP | 2000-106344 | 4/2000 |
| JP | 2000-267732 | 9/2000 |
| JP | 2000-353002 | 12/2000 |
| JP | 2001-61269 | 3/2001 |
| JP | 2001-107961 | 4/2001 |

OTHER PUBLICATIONS

Japanese Office Action dated May 14, 2007, issued in corresponding Japanese patent application No. 2003-133535, with English translation.
Japanese Office Action dated Oct. 24, 2008, issued in corresponding Japanese patent application No. 2003-133535.

* cited by examiner

*Primary Examiner*—Jared J Fureman
*Assistant Examiner*—Nicholas Ieva
(74) *Attorney, Agent, or Firm*—Fitzpatrick, Cella, Harper & Scinto

(57) ABSTRACT

In driving a movable body in a target direction, a force in another direction, which may act on the movable body, is reduced. A system includes a current amplifier, which drives X1 and X2 electromagnets (a first actuator) for aligning the movable body in the X direction, a system including a current amplifier, which drives Y1 and Y2 electromagnets (a second actuator) for aligning the movable body in the Y direction, a subordinate direction component correction unit, which reduces a force in the Y direction acting on the movable body when driving the movable body in the X direction by the first actuator, and a subordinate direction component correction unit, which reduces a force in the X direction acting on the movable body when driving the movable body in the Y direction by the second actuator.

3 Claims, 13 Drawing Sheets

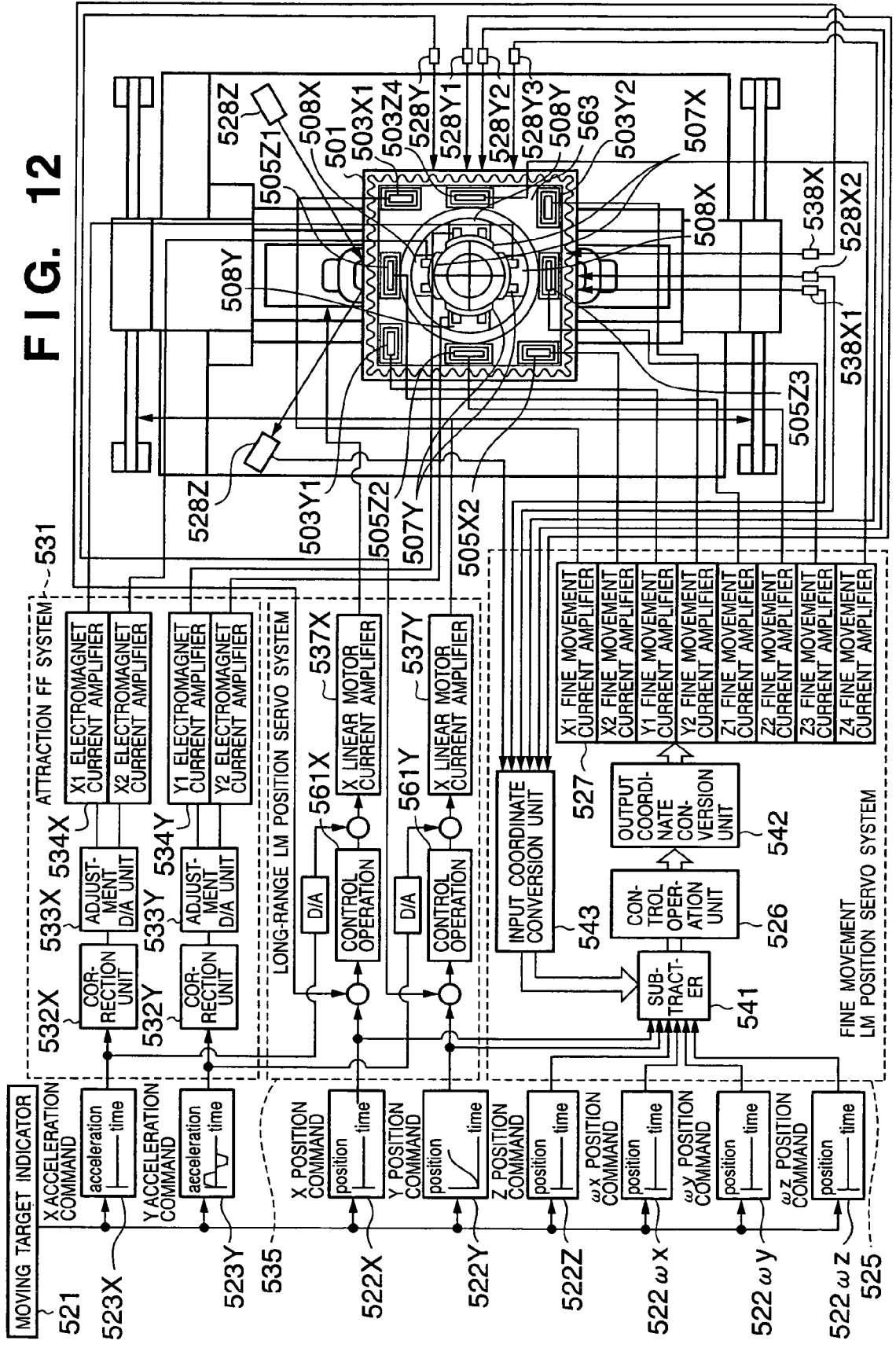

ALIGNMENT APPARATUS

FIELD OF THE INVENTION

The present invention relates to an alignment apparatus and an exposure apparatus.

BACKGROUND OF THE INVENTION

There is known an alignment apparatus for aligning an object, such as a substrate, in various apparatuses, such as an exposure apparatus, and the like. Examples of an alignment apparatus include one having a fine adjustment stage, which moves at a high precision on an X-Y stage, which moves with a long stroke (see, for example, Japanese Patent Laid Open No. 2000-106344). The fine adjustment stage can employ, e.g., an electromagnetic actuator in which electromagnets and magnetic bodies are so arranged as to face each other and generate an attraction force between them as an actuator for finely moving a wafer top plate (stage).

FIGS. 13A to 13D are schematic views showing the arrangement of an electromagnetic actuator. FIGS. 13A and 13B are top views; and FIGS. 13C and 13D, side views. An electromagnetic actuator shown in FIGS. 13A to 13D is made up of an electromagnet 508 formed by winding a coil 586 around the central tooth of an E magnetic body 585, and a magnetic body 507 arranged to face the attraction surface of the electromagnet 508.

If a current is supplied to the coil 586 of the electromagnet 508, a magnetic field is generated. The magnetic force of the magnetic field attracts the magnetic body 507 toward the electromagnet 508. At this time, the magnetic body 507 receives an attraction force mainly in a direction A, which reduces an interval between the magnetic body 507 and the electromagnet 508, as shown in FIG. 13A. If the central axis of the electromagnet 508 and that of the magnetic body 507 have a relative positional shift in the lateral direction, as shown in FIG. 13B, intervals between the magnetic body 507 and the left and right sides of the E magnetic body 585 are non-uniform. The left side, which has a smaller interval to the magnetic body 507, generates a larger attraction force. This generates a force in a lateral direction B so as to further reduce the interval on the left side. At the same time, a small rotational force is generated.

Also, if the central axis of the electromagnet 508 and that of the magnetic body 507 are not parallel to each other, a rotational force acts in a rotational direction C, which reduces an interval to the electromagnet 508. At the same time, a small translational force is generated in the central axial direction.

This non-uniformity in interval between the electromagnet 508 and the magnetic body 507, which may generate an attraction force in an undesirable direction, can be caused by a mechanical factor such as an assembly error. The non-uniformity can also be caused by driving a wafer top plate (stage) to a target position. Such a force may cause a disturbance in an alignment apparatus, and thus may degrade the performance, i.e., decrease the alignment precision and lengthen the settling time.

SUMMARY OF THE INVENTION

The present invention has been made on the basis of the recognition of the above-mentioned problems, and has as its object, when driving a movable body in a target direction, to reduce a force in another direction which may act on the movable body.

According to the present invention, there is provided an alignment apparatus, which aligns a movable body, comprising a plurality of actuators which drive the movable body, and a control system which controls the plurality of actuators. The plurality of actuators include a first actuator which drives the movable body in a first direction and a second actuator which drives the movable body in a second direction, and the control system controls the second actuator so as to reduce a force in the second direction acting on the movable body when driving the movable body in the first direction by the first actuator.

According to a preferred embodiment of the present invention, the control system can include, e.g., a first driving unit which drives the first actuator, a second driving unit which drives the second actuator, and a first correction unit which corrects a signal to be supplied to the second driving unit. The first correction unit corrects the signal to be supplied to the second driving unit so as to reduce the force in the second direction acting on the movable body when, e.g., driving the movable body in the first direction by the first actuator.

The first correction unit can correct the signal to be supplied to the second driving unit on the basis of a driving command for issuing a command to drive the first actuator. Alternatively, the first correction unit can correct the signal to be supplied to the second driving unit on the basis of a position and/or posture of a structure including the movable body.

The first actuator can include an actuator configured to drive the movable body by an attraction force acting between an electromagnet and a magnetic body. The alignment apparatus may further comprise a magnetic flux detection unit which detects a magnetic flux generated by the electromagnet, and in this case, the first correction unit can correct the signal to be supplied to the second driving unit on the basis of the magnetic flux detected by the magnetic flux detection unit. Alternatively, the alignment apparatus may further comprise an interval detection unit which detects an interval between the electromagnet and the magnetic body, and in this case, the first correction unit can correct the signal to be supplied to the second driving unit on the basis of the interval detected by the interval detection unit.

According to a preferred embodiment of the present invention, the control system preferably further controls the first actuator so as to reduce the force in the first direction acting on the movable body when driving the movable body by the second actuator. More specifically, the control system can further include a second correction unit which corrects a signal to be supplied to the first driving unit. The second correction unit corrects the signal to be supplied to the first driving unit so as to reduce the force in the first direction acting on the movable body when, e.g., driving the movable body in the second direction by the second actuator.

According to a preferred embodiment of the present invention, the plurality of actuators can further include a third actuator which drives the movable body in at least one direction other than the first and second directions. In this arrangement, the control system preferably controls the second and third actuators so as to reduce a force in a direction other than the first direction acting on the movable body, when driving the movable body in the first direction by the first actuator.

According to a preferred embodiment of the present invention, the first and second actuators can be arranged such that the first and second directions are perpendicular to each other.

The first actuator can include an actuator formed by arranging a pair of units so as to face each other. Each unit has an electromagnet and a magnetic body, and can be configured to move the movable body to a side of the unit by applying an attraction force between the electromagnet and the magnetic body.

Alternatively, the first and second actuators each can include an actuator formed by arranging a pair of units so as to face each other.

Alternatively, the second actuator can also include a linear motor.

According to the present invention, there is provided an exposure apparatus, which uses the above-mentioned alignment apparatus, comprising a substrate stage, and a projection system which projects a pattern onto a substrate on the substrate stage, wherein the substrate stage is aligned by the above-mentioned alignment apparatus.

Such an exposure apparatus is suitable for manufacturing a microdevice such as a semiconductor device. This device can be manufactured though a lithography process including a step of applying a photosensitive agent to a substrate such as a wafer, a step of transferring a pattern formed on a master, such as a reticle, or drawing a pattern on the substrate with a charged particle beam, such as an electron beam, and a step of developing the pattern of the substrate, onto which the pattern is transferred or on which the pattern is drawn.

According to the present invention, there is provided another alignment apparatus, which aligns a movable body, comprising a plurality of actuators, and a control system which controls the plurality of actuators, wherein the plurality of actuators include a first actuator which applies a driving force to the movable body in a first direction as a principal direction and a second actuator which applies a driving force to the movable body in a second direction different from the first direction as the principal direction, and the control system controls the second actuator so as to reduce an action force in the second direction acting on the movable body when applying the driving force to the movable body in the first direction by the first actuator.

According to a preferred embodiment of the present invention, the first actuator applies a driving force to the movable body in the second direction as a subordinate direction, and the second actuator applies a driving force to the movable body in the first direction as the subordinate direction.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 12 is a view showing an example of a control system, which controls the wafer stage shown in FIG. 9.

DETAILED DESCRIPTION OF THE PREFERRED EMBODIMENTS

Preferred embodiments of the present invention will be described below with reference to the accompanying drawings. The following description will explain an application of an alignment apparatus of the present invention to an exposure apparatus. However, the alignment apparatus can also be applied to a machine tool, office equipment, or the like, in addition to an exposure apparatus. In some cases, an alignment apparatus is called a "stage", as in the term "wafer stage". A "stage" serving as an alignment apparatus can be recognized as an apparatus including a movable body and a mechanism which moves the movable body. In other cases, the term "stage" is used to refer to a movable body which is driven by a driving mechanism, such as a "table" or "top plate". In this specification, the term "stage" in, e.g., "wafer stage", "X stage", "Y stage", or "fine adjustment stage", which is generally recognized in the art to refer to an apparatus including a movable body and a mechanism, which moves the movable body, means an alignment apparatus. On the other hand, when the term "stage" is used alone, it may mean a movable body such as a "table" or "top plate".

Figure 9:
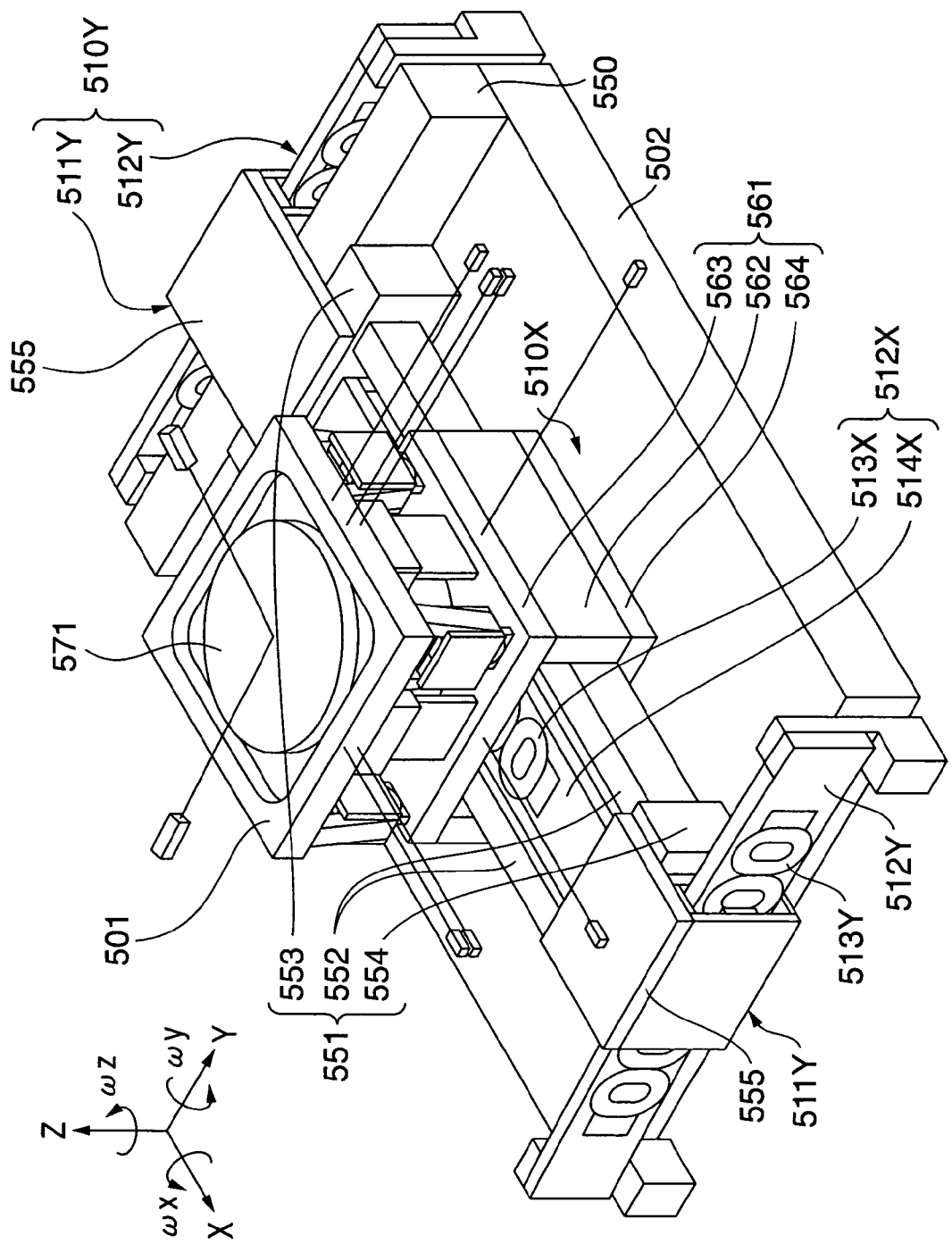
FIG. 9 is a perspective view showing the arrangement of a wafer stage (alignment apparatus) suitable as a constituent element of an exposure apparatus.
Figure 10:
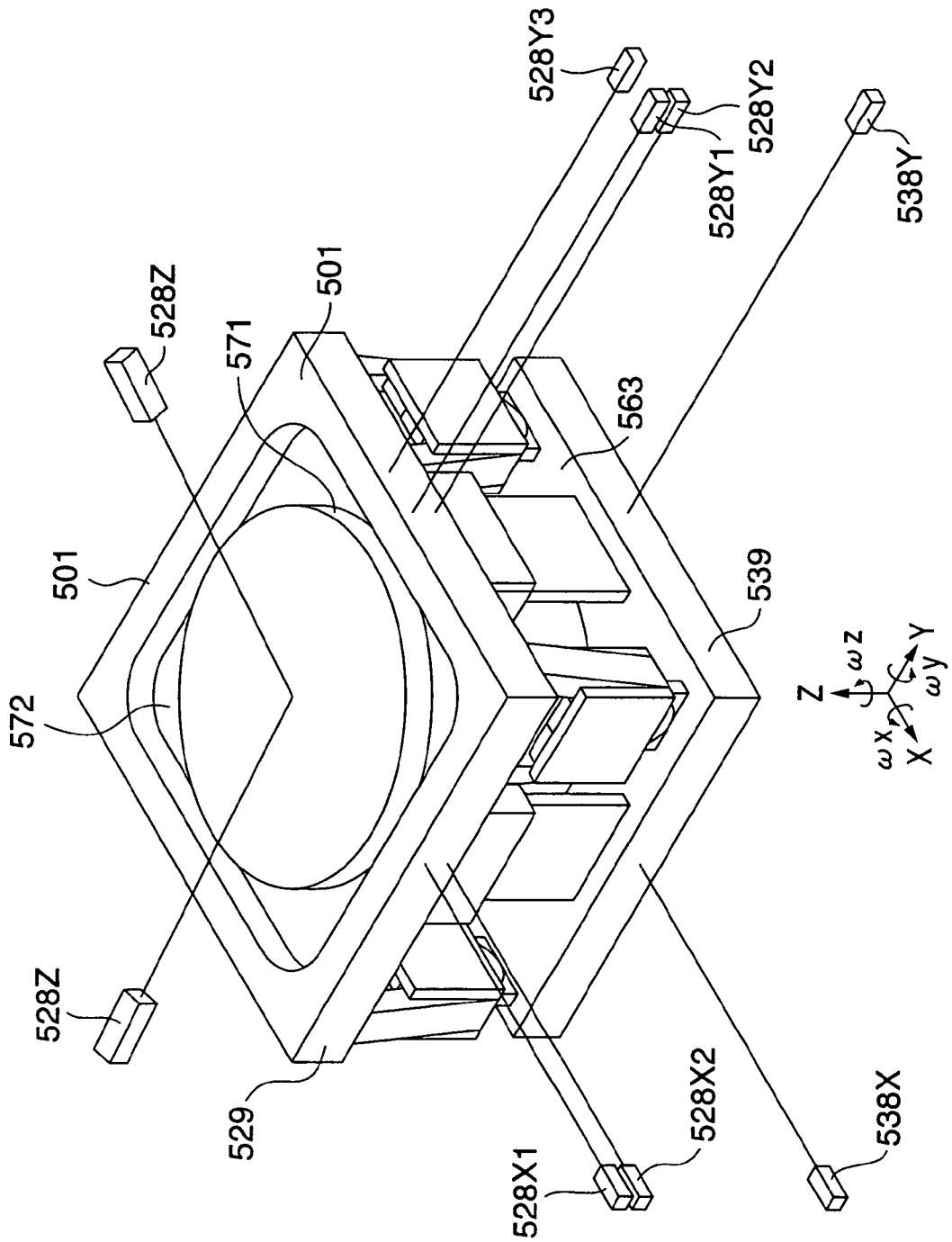
FIG. 10 is a perspective view of a wafer top plate and its periphery shown in FIG. 9.
Figure 11:
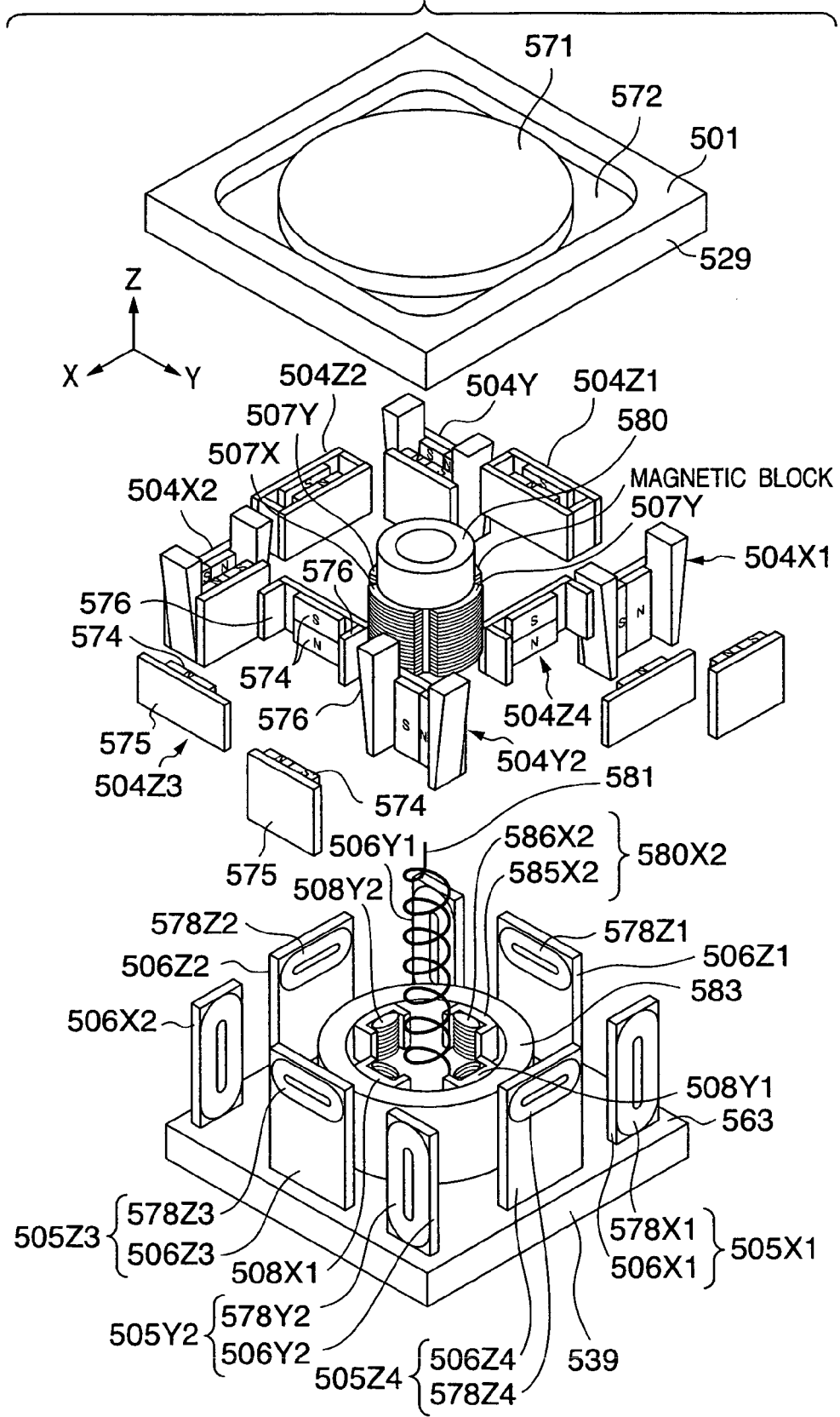
FIG. 11 is an exploded view of an X stage shown in FIG. 9.

FIG. 9 is a perspective view showing the arrangement of a wafer stage (alignment apparatus) suitable as a constituent element of an exposure apparatus. FIG. 10 is a perspective view of a wafer top plate and its periphery shown in FIG. 9. FIG. 11 is an exploded view of an X stage shown in FIG. 9. Typically, the exposure apparatus can comprise a mask stage (master stage), which holds a mask (master), a projection system, which projects a pattern formed on the mask, an illumination system which illuminates the mask, and the like, in addition to a wafer stage whose example is shown in FIG. 9. In an exposure apparatus, which uses a charged particle beam such as an electron beam, a pattern may be drawn by toggling irradiation with electron beams on and off, instead of using a mask.

The wafer stage shown in FIG. 9 has a structure which combines an X-Y stage and a fine adjustment stage.

A Y yaw guide 550 is fixed on a base surface plate 502. A side surface of the Y yaw guide 550 and the upper surface of the base surface plate 502 guide a Y stage 551. The Y stage 551 can slide in the Y direction by an air slide (not shown) provided for the Y stage 551. The Y stage 551 mainly comprises two X yaw guides 552, a first Y slider 553, and a second Y slider 554. The first Y slider 553 faces the side surface of the Y yaw guide 550 and the upper surface of the base surface plate 502 through air pads (not shown). The second Y slider 554 faces the upper surface of the base surface plate 502 through an air pad (not shown) on its lower surface. With the above-mentioned arrangement, the Y stage 551 is supported on the side surface of the Y yaw guide 550 and the upper surface of the base surface plate 502 to be slidable in the Y direction.

An X stage 561 mainly comprises two X stage side plates 562, an X stage upper plate 563, and an X stage lower plate 564. The X stage 561 surrounds the X yaw guides 552 of the Y stage 551 about the X axis. The X stage 561 is supported by an air slide (not shown) to be slidable in the X direction. The X stage 561 is guided by side surfaces of the two X yaw guides 552, which are constituent members of the Y stage 551, and the upper surface of the base surface plate 502. The X stage lower plate 564 faces the upper surface of the base surface plate 502 through an air pad (not shown) on its lower surface. The two X stage side plates 562 face the side surfaces of the two X yaw guides 552, which are constituent members of the Y stage 551, through air pads (not shown) on their side surfaces.

The lower surface of the X stage upper plate 563 and the upper surfaces of the X yaw guides 552 are not in contact with each other, and the upper surface of the X stage lower plate 564 and the lower surfaces of the X yaw guides 552 are not in contact with each other. With the above-mentioned arrangement, the X stage 561 is supported by the side surfaces of the two X yaw guides 552 and the upper surface of the base surface plate 502 to be slidable in the X direction.

The X stage 561 moves in the Y direction as the Y stage 551 moves in the Y direction, and can move in the X direction with respect to the Y stage 551. Hence, the X stage 561 is slidable two dimensionally, i.e., in the X and Y directions.

In this embodiment, the X-Y stage unit employs one polyphase coil switching type long-range X linear motor 510X for X-direction driving and two polyphase coil switching type long-range Y linear motors 510Y for Y-direction driving. A stator 512X of the long-range X linear motor 510X for X direction driving is arranged in the Y stage 551 while a movable element 511X of the long-range X linear motor 510X is arranged in the X stage 561. The long-range X linear motor 510X generates a driving force in the X direction between the X stage 561 and the Y stage 551. A stator 512Y of the long-range Y linear motors 510Y may be provided integrally with the base surface plate 502 or may be provided for a member independent, in terms of vibration, of the base surface plate 502. Movable elements 511Y of the long-range Y linear motors 510Y are provided integrally with the Y stage 551 through connecting plates 555.

With this arrangement, the long range Y linear motors 510Y for Y-direction driving drive the Y stage 551 in the Y direction with respect to the base surface plate 502.

In the stators 512X and 512Y of the long range linear motors 510X and 510Y, a plurality of coils 513X and 513Y are arranged in stroke directions and held by coil fixing frames 514X and 514Y, respectively. Each of the movable elements 511X and 511Y of the long range linear motors 510X and 510Y has a box-like construction in which a pair of structures are arranged to face each other and sandwich each of the coils 513X and 513Y. The pair of structures are formed by placing on yoke plates magnets with four poles whose gap width is equal to the coil span of the coils 513X and 513Y. Each of the long-range linear motors 51X and 510Y generates a thrust by selectively supplying currents to the stator coils in accordance with the position of the movable element.

A wafer top plate 501 has a wafer chuck 571, which chucks a wafer to be processed and can align the wafer in directions with six degrees of freedom, i.e., in the translational X, Y, and Z directions and the rotational $\omega x$, $\omega y$, and $\omega z$ directions. The wafer top plate 501 has a rectangular plate-like shape and has a concave portion in the center. The wafer chuck 571 for mounting the wafer is arranged in the concave portion 572. Minors 529 are provided on the side surfaces of the wafer top plate 501 to reflect laser light beams (measurement light) from laser interferometers. The laser interferometers measure the position of the wafer top plate 501.

Position measurement of the X stage 561 and wafer top plate 501 will be described with reference to FIG. 10.

Mirrors are formed on the side surfaces of the X stage upper plate 563 of the X stage 561 to reflect laser light beams from laser interferometers which measure the position of the X stage 561. Laser interferometers 538X and 538Y irradiate X stage side surface minors 539 with laser light beams in the X and Y directions and can precisely measure the X- and Y-direction positions of the X stage 561.

The minors 529 are arranged on the side surfaces of the wafer top plate 501 to reflect laser light beams from laser interferometers and can measure the position of the wafer top plate 501. The wafer top plate 501 is irradiated with six laser light beams to measure the position of the wafer top plate 501 with six degrees of freedom. Laser interferometers 528X1 and 528X2 measure the X direction position and the rotation amount in the $\omega y$ direction of the wafer top plate 501 with two interferometer beams, which are parallel to the X axis and have different Z direction positions. Laser interferometers 528Y1 to 528Y3 measure the Y direction position and the rotation amounts in the $\omega x$ and $\omega y$ directions of the wafer top plate 501 with three interferometer beams, which are parallel to the Y axis and have different X and Z direction positions. Laser interferometers 528Z cause measurement light to come incident on a wafer mounted on the wafer chuck 571 and measure the reflection position of the measurement light, thereby measuring the Z direction position of the wafer (or the Z direction position of the wafer top plate).

As described above, the positions of the X stage 561 and wafer top plate 501 can separately be measured.

A fine movement actuator unit, which generates a driving force between the X stage 561 and the wafer top plate 501, will be described with reference to FIG. 11.

An XY stage (a stage made up of an X stage and a Y stage), serving as a reference for exerting a thrust or an attraction force on the wafer top plate 501, is arranged below the wafer top plate 501, as shown in FIG. 9.

Eight fine movement linear motor movable elements 504 (504X1, 504X2, 504Y1, 504Y2, and 504Z1 to 504Z4) are attached to the lower surface of the wafer top plate 501. Each movable element 504 has two sets of structures, each comprising yokes 575 and magnets 574 with two poles magnetized in a direction of thickness. The two sets of structures are coupled by side plates 576 so as to face each other, thereby forming a box-like construction. The box-like construction sandwiches fine movement linear motor stators 505 (505X1, 505X2, 505Y1, 505Y2, and 505Z1 to 505Z4) in a noncontact manner.

Out of the eight movable elements 504, the four movable elements 504Z1 to 504Z4 are arranged almost at the centers of the four sides, respectively, of the rectangular top plate 501 and constitute Z movable elements 504Z for finely driving the wafer top plate 501 in the Z direction with respect to the X stage 561. In the Z movable elements 504Z, magnets 574Z with two poles are arranged in the Z direction to interact with currents flowing in oblong coils 578Z1 to 578Z4 and generate a thrust in the Z direction. The four movable elements 504Z1 to 504Z4 will be referred to as Z1 to Z4 movable elements 504Z1 to 504Z4, respectively.

Out of the four remaining movable elements 504, the two movable elements 504X1 and 504X2 arranged at diagonal corners of the rectangular top plate constitute X movable elements for finely driving the wafer top plate 501 in the X direction with respect to the X stage 561. In the X movable elements 504X1 and 504X2, magnets 574X with two poles are arranged in the X direction to interact with currents flowing in oblong coils 578X1 and 578X2 of the X stators 505X1 and 505X2, whose linear portions are perpendicular to the X direction and generate a thrust in the X direction. The two movable elements 504X1 and 504X2 will be referred to as X1 and X2 movable elements 504X1 and 504X2, respectively.

The two remaining movable elements 504Y1 and 504Y2 arranged at the remaining diagonal corners of the rectangular top plate constitute Y movable elements for finely driving the wafer top plate 501 in the Y direction with respect to the X stage 561. In the Y movable elements 504Y1 and 504Y2, magnets 574Y with two poles are arranged in the Y direction to interact with currents flowing in oblong coils 578Y1 and 578Y2 of the Y stators 505Y1 and 505Y2 whose linear portions are perpendicular to the Y direction and generate a thrust in the Y direction. The two movable elements 504Y1 and 504Y2 will be referred to as Y1 and Y2 movable elements 504Y1 and 504Y2, respectively.

A magnetic body support cylinder 580 is provided almost at the center of the lower surface of the rectangular wafer top plate 501. Four arcuate magnetic blocks 507 (507X and 507Y) are fixed on the outer periphery of the magnetic body support cylinder 580. Out of these magnetic blocks, the two arcuate magnetic blocks 507X are arranged in the X direction to be symmetric about the magnetic body support cylinder 580. The magnetic blocks 507X face in a noncontact manner E electromagnets 508X, which are also arranged in the X direction to be symmetric about the magnetic body support cylinder 580. The magnetic blocks 507X receive large attraction forces in the X direction from the E electromagnets 508X. These arcuate magnetic blocks 507X arranged to face each other in the X direction will be referred to as X1 and X2 blocks. One of the magnetic blocks 507X and the E electromagnet 508X, which faces it, constitute a driving unit (actuator).

The two remaining arcuate magnetic blocks 507Y are arranged in the Y direction to be symmetric about the magnetic body support cylinder 580. The magnetic blocks 507Y face in a noncontact manner E electromagnets 508Y, which are also arranged in the Y direction to be symmetric about the magnetic body support cylinder 580. The magnetic blocks 507Y receive large attraction forces in the Y direction from the E electromagnets 508Y. These arcuate magnetic blocks 507Y, arranged to face each other in the Y direction, will be referred to as Y1 and Y2 blocks. One of the magnetic blocks 507Y and the E electromagnet 508Y, which faces it, constitute a driving unit (actuator).

A light weight compensation spring 581 is arranged in the hollow portion of the magnetic body support cylinder 580. The upper end of the spring 581 is connected to the center of the lower surface of the wafer top plate 501 to support the light weight of the wafer top plate 501. The light weight compensation spring 581 is designed such that the spring constants in the light weight support direction (perpendicular direction) and other directions with five degrees of freedoms are sufficiently small. With the spring 581, vibrations transmitted from the X stage 561 to the wafer top plate 501 can almost be neglected.

The Z-coordinates of the lines of action of two forces generated by the X1 and X2 movable elements 504X1 and 504X2 almost coincide with each other. The Z-coordinates of the lines of action of the two forces generated by the X1 and X2 movable elements 504X1 and 504X2 almost coincide with the Z-coordinate of the barycenter of a top plate structure (movable body), which includes the X1 and X2 movable elements 504X1 and 504X2, Y1 and Y2 movable elements 504Y1 and 504Y2, Z1 to Z4 movable elements 504Z1 to 504Z4, magnetic body support cylinder 580, four arcuate magnetic blocks 507, and wafer top plate 501. Thus, a rotational force about the Y-axis can hardly act on the wafer top plate 501, depending on thrusts in the X direction acting on the X1 and X2 movable elements 504X1 and 504X2.

The Z-coordinates of the lines of action of two forces generated by the Y1 and Y2 movable elements 504Y1 and 504Y2 almost coincide with each other. The Z-coordinates of the lines of action of the two forces generated by the Y1 and Y2 movable elements 504Y1 and 504Y2 almost coincide with the Z-coordinate of the barycenter of the top plate structure (movable body), which includes the X1 and X2 movable elements 504X1 and 504X2, Y1 and Y2 movable elements 504Y1 and 504Y2, Z1 to Z4 movable elements 504Z1 to 504Z4, magnetic body support cylinder 580, four arcuate magnetic blocks 507, and wafer top plate 501. Thus, a rotational force about the X-axis can hardly act on the wafer top plate 501, depending on thrusts in the Y direction acting on the Y1 and Y2 movable elements 504Y1 and 504Y2.

The Z-coordinates of the lines of action of attraction forces acting on the X1 and X2 blocks 507X almost coincide with each other. The Z-coordinates of the lines of action of the two attraction forces acting on the X1 and X2 blocks 507X almost coincide with the Z-coordinate of the barycenter of the top plate structure which includes the X1 and X2 movable elements 504X1 and 504X2, Y1 and Y2 movable elements 504Y1 and 504Y2, Z1 to Z4 movable elements 504Z1 to 504Z4, magnetic body support cylinder 580, four arcuate magnetic blocks 507, and wafer top plate 501. Thus, a rotational force about the Y-axis can hardly act on the wafer top plate 501, depending on attraction forces in the X direction acting on the X1 and X2 blocks 507X.

The X-coordinates of the lines of action of two attraction forces in the X direction acting on the X1 and X2 blocks 507X almost coincide with the X-coordinate of the barycenter of the top plate structure (movable body), which includes the X1 and X2 movable elements 504X1 and 504X2, Y1 and Y2 movable elements 504Y1 and 504Y2, Z1 to Z4 movable elements 504Z1 to 504Z4, magnetic body support cylinder 580, four arcuate magnetic blocks 507, and wafer top plate 501. Thus, a rotational force about the Z-axis can hardly act on the wafer top plate 501, depending on attraction forces in the X direction acting on the X1 and X2 blocks 507X.

The Z-coordinates of the lines of action of two attraction forces acting on the Y1 and Y2 blocks 507Y almost coincide with each other. The Z-coordinates of the lines of action of the two attraction forces acting on the Y1 and Y2 blocks 507Y almost coincide with the Z-coordinate of the barycenter of the top plate structure, which includes the X1 and X2 movable elements 504X1 and 504X2, Y1 and Y2 movable elements 504Y1 and 504Y2, Z1 to Z4 movable elements 504Z1 to 504Z4, magnetic body support cylinder 580, four arcuate magnetic blocks 507, and wafer top plate 501. Thus, a rotational force about the X-axis can hardly act on the wafer top plate 501, depending on attraction forces in the Y direction acting on the Y1 and Y2 blocks 507Y.

The X-coordinates of the lines of action of two attraction forces in the Y direction acting on the Y1 and Y2 blocks 507Y almost coincide with the X-coordinate of the barycenter of the top plate structure, which includes the X1 and X2 movable elements 504X1 and 504X2, Y1 and Y2 movable elements 504Y1 and 504Y2, Z1 to Z4 movable elements 504Z1 to 504Z4, magnetic body support cylinder 580, four arcuate magnetic blocks 507, and wafer top plate 501. Thus, a rotational force about the Z-axis can hardly act on the wafer top plate 501, depending on attraction forces in the Y direction acting on the Y1 and Y2 blocks 507Y.

One end of each of the stators 505 (505X1, 505X2, 505Y1, 505Y2, 505Z1 to 505Z4) of eight fine movement linear motors 503 (linear motors each of which is made up of the stator 504 and movable element 505) for controlling the position of the wafer top plate 501 in six axial directions and the four E electromagnets 508 (508X1, 508X2, 508Y1, and 508Y2) supported on the magnetic body support cylinder 580 to give an acceleration in the X and Y directions to the wafer top plate 501, and the other end of the light weight compensation spring 581 for supporting the light weight of the wafer top plate 501 are fixed at the upper portion of the X stage upper plate 563.

The stators 505 are formed by supporting the oblong coils 578 (578X1, 578X2, 578Y1, 578Y2, and 578Z1 to 578Z4) with coil fixing frames 506 (506X1, 506X2, 506Y1, 506Y2, and 506Z1 to 506Z4), respectively. The stators 505 face the linear motor movable elements 504 (504X1, 504X2, 504Y1, 504Y2, and 504Z1 to 504Z4) fixed on the lower surface of the wafer top plate 501 in a noncontact manner.

Out of the eight stators 505, the four stators 505Z (505Z1 to 505Z4) are arranged almost at the centers of the four sides, respectively, of the rectangular X stage upper plate 563 and constitute Z stators for finely moving the wafer top plate 501 in the Z direction with respect to the X stage 561. The Z stators 505Z are arranged such that the linear portions of the oblong coils 578Z (578Z1 to 578Z4) are perpendicular to the Z direction. The Z stators 505Z cause Z-direction thrusts to act on the magnets 574Z with two poles arranged in the Z direction of the Z movable elements 504Z. The coils 578Z1 to 578Z4 will be referred to as Z1 to Z4 coils, respectively.

Out of the four remaining stators, the two stators 505X (505X1 and 505X2) are arranged at diagonal corners of the rectangular X stage upper plate 563 and constitute X stators. The X stators 505X are arranged such that the two linear portions of the oblong coils 578X (578X1 and 578X2) are perpendicular to the X direction. The X stators cause X-direction thrusts to act on the magnets 574X with two poles arranged in the X direction of the X movable elements 504X. The coils 578X1 and 578X2 will be referred to as X1 and X2 coils, respectively.

The two remaining stators 505Y (505Y1 and 505Y2) are arranged at the remaining diagonal corners of the rectangular X stage upper plate 563 and constitute Y stators. The Y stators 505Y are arranged such that the two linear portions of the oblong coils 578Y (578Y1 and 578Y2) are perpendicular to the Y direction. The Y stators cause Y-direction thrusts to act on the magnets 574Y with two poles arranged in the Y direction of the Y movable element 574Y. The coils 578Y1 and 578Y2 will be referred to as Y1 and Y2 coils, respectively.

An electromagnet support cylinder 583 is arranged almost at the center of the X stage upper plate 563. The four E electromagnets 508 (508X1, 508X2, 508Y1, and 508Y2) are arranged inside the electromagnet support cylinder 583. The E electromagnets 508 comprise magnetic blocks 585 (585X1, 585X2, 585Y1, and 585Y2) each of which has an almost E-shaped section as seen in the Z direction and coils 586 (586X1, 586X2, 586Y1, and 586Y2). Each coil 586 is wound around the central projection (tooth) of the corresponding E electromagnet. The end faces of the three projections of the E electromagnet 508 are not linear, but arcuate. The end faces of the three projections of the E electromagnet 508 face the corresponding arcuate magnetic block 507 fixed on the wafer top plate 501 in a noncontact manner through an air gap of about several tens of μm or more. By supplying a current to the coil 586, an attraction force acts on the arcuate magnetic block 507.

Two out of the four E electromagnets 508 are arranged in the X direction so as to face the X1 and X2 blocks 507X, respectively. They exert attraction forces in the X and −X directions on the X1 and X2 blocks 507X, respectively. They will be referred to as X1 and X2 electromagnets 508X.

The two remaining E electromagnets 508 are arranged in the Y direction so as to face the Y1 and Y2 blocks 507Y, respectively. They exert attraction forces in the Y and −Y directions on the Y1 and Y2 blocks 507Y, respectively. They will be referred to as Y1 and Y2 electromagnets 508Y.

Each electromagnet 508 can generate only an attraction force. Thus, electromagnets which generate an attraction force in the + (positive) direction and ones which generate an attraction force in the − (negative) direction are provided as the electromagnets 508 for each of the X and Y driving directions.

The opposing surfaces of each magnetic block 507 and the corresponding E electromagnet 508 are cylindrical about the Z-axis. The four magnetic blocks 507 and four E electromagnets 508 can rotate freely about the Z-axis ($\omega z$ direction) without any contact. That is, the wafer top plate 501 and X stage 561 can move relatively in the $\omega z$ direction. Even if they rotate in the $\omega z$ direction, the air gap between the end face of the E electromagnet 508 and the magnetic block 507 does not change, and an attraction force generated by the E electromagnet 508 for a current having the same magnitude does not change.

FIG. 12 is a block diagram showing an example of a control system which controls the wafer stage described with reference to FIGS. 9 to 11.

A moving target indicator 521 outputs target values such as the positions in the six axial directions of the wafer top plate 501 to position profile generators 522 (522X, 522Y, 522Z, 522$\omega$x, 522$\omega$y, and 522$\omega$z) and acceleration profile generators 523 (523X and 523Y). The position profile generators 522 generate a relationship between the time and the position of the wafer top plate 501 for each of the six axial directions, i.e., the translational X, Y, and Z directions and the rotational $\omega$x, $\omega$y, and $\omega$z directions on the basis of the target values from the moving target indicator 521. The acceleration profile generators 523 generate a relationship between the time and the acceleration to be generated for each of the two axial directions, i.e., the translational X and Y directions on the basis of the target values from the moving target indicator 521. These profiles are created for the representative position of the wafer top plate 501 as regarded as a rigid body. Generally, the barycenter of the wafer top plate 501 is used as the representative position.

In this embodiment, the position profile generators 522 provide the time, the position of the barycenter of the wafer top plate 501, and the rotation about the barycenter as a function of time. The acceleration profile generators 523 provide X- and Y-direction acceleration profiles of the barycenter of the wafer top plate 501.

In this embodiment, since long range movement is performed only in the Y-axis direction, a position profile which extends to a target position is provided only for the Y-axis. A position profile at a constant value is provided for each of the remaining axes so as to keep the position of the wafer top plate 501 at the current position. As for the acceleration profiles, the acceleration profile generators provide an acceleration/deceleration pattern of movement for the Y-axis while they provide a profile always at zero for the X-axis, without any movement.

Outputs from the position profile generators 522, i.e., the positions of the barycenter of the wafer top plate 501 in the six axial directions and rotation about the barycenter are input to a fine movement LM position servo system, which controls the fine movement linear motors 503. An output from the position profile generator 522X and that from the position profile generator 522Y are also input to a long-range LM position servo system 535. The long-range LM position servo system 535 performs feedback control for a current of the long range linear motors of the X-Y stage, which move the X stage 561 in the X and Y directions.

An output from the acceleration profile generator 523X and that from the acceleration profile generator 523Y are input to an attraction FF system 531, which performs feed forward control for attraction forces of the electromagnets 508.

A fine movement LM position servo system 525 has a subtracter 541, an operation unit 526, an output coordinate conversion unit 542, fine movement current amplifiers 527, a wafer top plate position measurement system 528, and an input coordinate conversion unit 543. The subtracter 541 outputs deviations of the current X, Y, Z, ωx, ωy, and ωz positions (target positions) of the barycenter of the wafer top plate 501, which are output from the position profile generators 522, from the actual X, Y, Z, ωx, ωy, and ωz positions (measurement positions) of the barycenter of the wafer top plate 501. The operation unit 526 performs a control operation, typified by a PID, or the like, and calculates driving commands for the six axes, on the basis of deviation signals from the subtracter 541. The output coordinate conversion unit 542 performs an operation to distribute the driving commands for the six axes to the X1, X2, Y1, Y2, and Z1 to Z4 fine movement linear motors 503 and outputs the results as analog voltages. The fine movement current amplifiers 527 supply currents proportional to the output analog voltages to the X1, X2, Y1, Y2, and Z1 to Z4 fine movement linear motors 503. The wafer top plate position measurement system 528 has a measurement unit, which comprises the laser interferometers 528X1, 528X2, 528Y1 to 528Y3, and 528Z, which measure the X, Y, Z, ωx, ωy, and ωz positions almost at an exposure point of the wafer top plate 501. The input coordinate conversion unit 543 converts the X, Y, Z, ωx, ωy, and ωz positions almost at the exposure point of the wafer top plate 501 into the X, Y, Z, ωx, ωy, and ωz positions of the barycenter of the wafer top plate 501.

The fine movement LM position servo system 525 serves for each axis as a general position servo system, which uses an output from the corresponding position profile generator 522 as a command value, and receives a force from the attraction FF system 531 when a large thrust is necessary. As described above, attraction forces of the electromagnets 508 reduce a rotational force acting on the wafer top plate 501 by causing their line of action and the barycenter of the wafer top plate 501 to coincide with each other. Since the fine movement linear motors 503 only need to generate small thrusts to eliminate a small positional deviation from the target position, heat generation by current is suppressed. Even if interlocking with the attraction FF system 531 fails, a current flow, which may cause heat generation can be prevented by controlling a current from each linear motor using hardware or software.

The attraction FF system 531 has a control system for generating by the acceleration profile generator 523X a resultant thrust in the X direction proportional to an output between the pair of X1 and X2 electromagnets 508X and the X1 and X2 blocks 507X, and a control system for generating by the acceleration profile generator 523Y a resultant thrust in the Y direction proportional to an output between the pair of Y1 and Y2 electromagnets 508Y and the Y1 and Y2 blocks 507Y. Each control system has a correction unit 532 (532X or 532Y), an adjustment unit 533 (533X or 533Y), and two electromagnet current amplifiers 534 (534X or 534Y), which separately drive the coils 586 of the pair of electromagnets 508.

The correction units 532 correct nonlinear relationships between currents of the electromagnets 508 and thrusts. Typically, each correction unit 532 can be configured as a square root operation unit which stores signs. An attraction force of an electromagnet is generally proportional to the square of a current of the electromagnet. A required force is proportional to an output from each acceleration profile generator 523, and the square root of the output is used as a current command. This exerts an attraction force which is proportional to the square of the square root of the output from the acceleration profile generator 523. That is, an attraction force proportional to the output from the acceleration profile generator 523 acts. Also, since an output from the acceleration profile generator 523 has a sign, the correction unit 532 performs a square root operation for the absolute value of the output from the acceleration profile generator 523. After the operation, the acceleration profile generator 523 adds a sign to the resultant value and outputs it to the corresponding adjustment unit 533.

Each adjustment unit 533 adjusts an attraction force between the magnetic body 507 and the corresponding electromagnet 508 of the pair of electromagnets 508, and adjusts the magnitude and direction of a resultant force to desired values. The electromagnet 508 can only generate a force which attracts the corresponding magnetic body 507, regardless of the direction of current. Under the circumstances, the magnetic bodies 507 are sandwiched between the pair of electromagnets 508, and the electromagnets 508 generate forces in opposing directions with respect to the magnetic body plates. The two forces are adjusted, thereby controlling the magnitude and direction of the resultant force acting on the magnetic bodies 507. The easiest way to implement this is to select to which of the pair of electromagnets 508 a current should be supplied, supply a current having a magnitude proportional to an output from the correction unit 532 to the electromagnet current amplifiers 534, and control the current of the other electromagnet to zero. If an output from each correction unit 532 is zero, the currents of both the electromagnets 508 are controlled to zero. With the above-mentioned control, a thrust proportional to the magnitude of an output from the acceleration profile generator 523 is applied from the pair of electromagnets to the magnetic bodies 507 in a desired direction.

When an output from the correction unit 532 is zero, bias currents of the same magnitude may be supplied to the two electromagnets 508. This makes more linear a relationship between the current (the strength of a magnetic field) and the magnetic flux density in the center of operation of the B-H curve of each electromagnet 508. In this case, the correction unit and adjustment unit cooperate to issue commands to supply appropriate currents to the two electromagnets 508 on the basis of an output from the acceleration profile.

More specifically, let Va be an output from the acceleration profile generator 523 in the + moving direction, Ib be a bias current, Ip be a coil current of the electromagnet 508, which generates an attraction force in the +moving direction, and Im be a coil current of the electromagnet 508, which generates an attraction force in the − (negative) moving direction. In this case, for a predetermined proportionality constant K, lp and lm which satisfy $$Va = K((lp-lb)^2 - (lm-lb)^2)$$

are output (wherein ^2 represents a square). An attraction force of the electromagnet 508 can generate a larger thrust with a less ampere turn than a Lorentz force of a linear motor. For this reason, heat generation due to the electromagnets hardly poses a problem, unlike heat generation in acceleration/deceleration of a stage with only linear motors.

A current of each electromagnet 508 is controlled to zero while the wafer top plate 501 moves at a constant velocity. Thus, any disturbance such as floor vibrations, or the like, is not transmitted to the wafer top plate 501 through the electromagnets 508. In this state, alignment of the wafer top plate 501 in six axial directions is controlled at high precision using the fine movement linear motors.

In this embodiment, the fine movement linear motors 503 and electromagnets 508 coupled to the wafer top plate 501 each has a short stroke, and cannot apply forces to the wafer top plate 501 over a long distance. Under the circumstances, a thrust and an attraction force are applied to the wafer top plate 501 in the X and Y directions while the X stage 561, serving as a reference for applying a force to the wafer top plate 501, is moved in the X and Y directions. With this operation, a thrust and an attraction force in the X and Y directions are applied to the wafer top plate 501 over the long distance with respect to the X and Y directions. To implement this, the fine movement LM position servo system 525, the two Y linear motors 510Y and one X linear motor 510X are provided and connected to the fine movement LM position servo system 525.

The long-range LM position servo system 535 has an X control system and a Y control system. The X control system controls the X position of the X stage 561 by the one X linear motor 510X to follow the X position profile. The Y control system controls the Y positions of the X stage 561 and Y stage 551 by the two Y linear motors 510Y to follow the Y position profile.

The X and Y control systems of the long range LM position servo system 535 output differences (deviation signals), from the X and Y position profiles, of the current X- and Y-direction positions of the X stage 561, which are measured by interferometer beams that hit the reflection mirrors on the side surfaces of the X stage upper plate 563. The control systems perform a control operation, typified by a PID, or the like, and calculate acceleration commands in the X and Y directions. The acceleration commands are output through X and Y linear motor current amplifiers 537 to the X and Y linear motors 510X and 510Y.

As a result, the Y linear motors 510Y generate a thrust for accelerating in the Y direction the total mass of the Y stage 551, X stage 561, wafer top plate 501, and the like. On the other hand, the X linear motor 510X generates a thrust for accelerating in the X direction the total mass of the X stage 561, wafer top plate 501, and the like.

In this embodiment, outputs from the acceleration profile generators 523 are added to outputs from control operation units 561 (561X and 561Y) of the long range LM position servo system 535. The results are supplied to the motor current amplifiers 537 (537X and 537Y), thereby issuing acceleration commands to the long-range linear motors 510X and 510Y in a feed forward manner and preventing a positional deviation accumulation during acceleration.

In this embodiment, the acceleration profiles are supplied to the attraction FF system 531 and long-range LM position servo system 535 in a feed forward manner. They may also be supplied to the fine movement LM position servo system 525 in a feed forward manner. Acceleration profiles may be created not only in the X and Y directions, but also in all six axial directions and may be supplied to the fine movement LM position servo system 525 in a feed forward manner.

After acceleration of the X stage 561 and wafer top plate 501 as well, the X stage 561 and Y stage 551 move on the basis of the X and Y position profiles. After the acceleration, the two Y linear motors and one X linear motor only generate reaction forces of thrusts generated by the X1, X2, Y1, and Y2 fine movement linear motors.

The electromagnets 508X1 and 508X2 generate attraction forces almost in the X-axis direction while the electromagnets 508Y1 and 508Y2 generate attraction forces almost in the Y-axis direction (these directions will be referred to as principal directions hereinafter). These electromagnets, however, can generate forces in directions other than the above-mentioned directions (to be referred to as subordinate directions hereinafter) for the following two reasons.

First, if the barycenter of the top plate structure (movable body) integrated with the wafer top plate 501 deviates from the line of action of an attraction force generated by the electromagnets 508, a rotational force acts about the barycenter of the top plate structure (movable body). It is desirable that the line of action of the attraction force passes through the barycenter of the movable body. However, in some cases, the line of action inevitably deviates from the barycenter due to the design constraints, and a rotational force as described above may occur.

Second, an attraction force generated by each electromagnet 508 varies depending on an interval between the electromagnet 508 and the corresponding magnetic body 507. An attraction force generated by an electromagnet is generally inversely proportional to the square of an interval between the electromagnet and a corresponding magnetic body. The electromagnet generates a larger attraction force with a shorter interval.

Figure 13A:
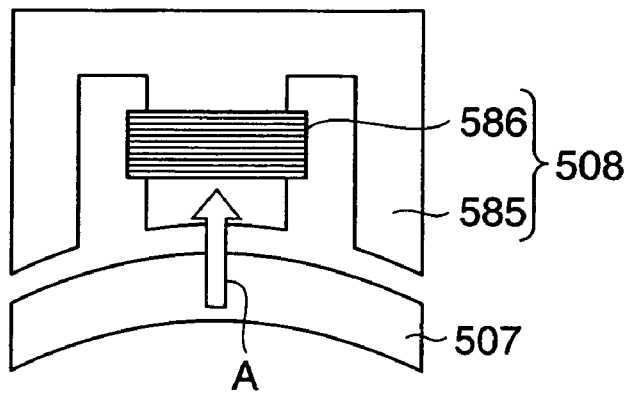
FIGS. 13A to 13D are views for explaining a force in a subordinate direction, which may act when an actuator generates a force in a principal direction (target direction), and problems caused by the force.
Figure 13C:
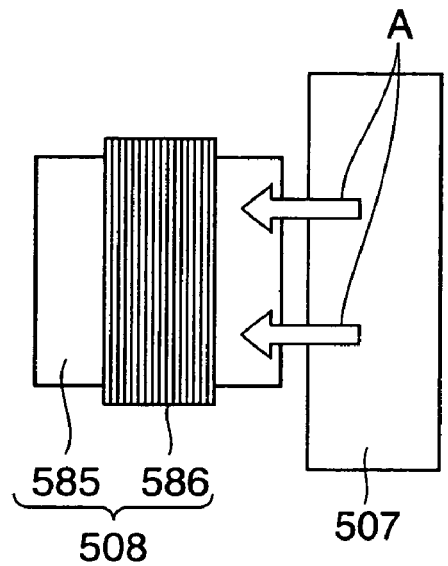
Figure 13B:
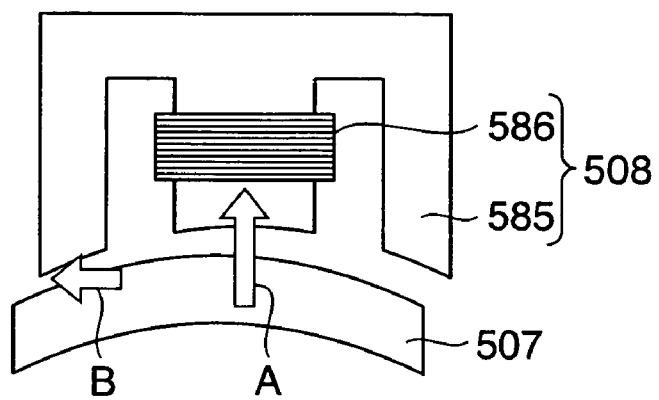
Figure 13D:
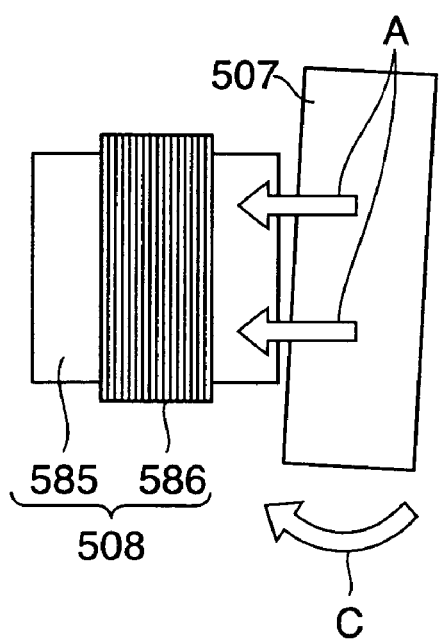

The second reason will be described in detail with reference to FIGS. 13A to 13D. FIGS. 13A to 13D are schematic views showing the electromagnets 508 and magnetic blocks 507. FIGS. 13A and 13B are top views; and FIGS. 13C and 13D, side views.

If the central axis of each electromagnet 508 and that of the corresponding magnetic body 507 have a relative positional shift in the lateral direction with respect to directions in which principal attraction forces occur (i.e., the principal directions), intervals between the magnetic body 507 and the left and right sides of the E-sectional magnetic block 585 of the electromagnet 508 become non-uniform. A side which has a smaller interval generates a larger attraction force. This generates a force in a lateral direction B (i.e., the subordinate direction) so as to further reduce the interval on the side which has the smaller interval. At the same time, a small rotational force is generated. Similarly, if the central axis of each electromagnet 508 and that of the corresponding magnetic body 507 are not parallel to each other, a rotational force acts in a rotational direction C (i.e., the subordinate direction) so as to further reduce the interval on a side which has a smaller interval. At the same time, a small translational force occurs in the central axial direction. This non-uniformity in interval between the electromagnet 508 and the magnetic body 507, which may generate an attraction force in the subordinate direction, can be caused by a mechanical factor such as an assembly error. The non-uniformity can also be caused by driving the wafer top plate 501 to a target position. In the latter case, the electromagnets 508 are driven at the time of acceleration/deceleration of the wafer top plate 501. Since a large force is applied to the wafer top plate 501 at this time, an interval fluctuation or posture fluctuation is likely to occur.

A force in the subordinate direction described above may cause a disturbance for the wafer top plate 501, and thus may degrade the performance, i.e., decrease the alignment precision and prolong the settling time.

Examples for reducing forces in the subordinate directions will be described below. These forces in the subordinate directions can be reduced by, e.g., incorporating a subordinate direction component reducing system in the attraction FF system (a feed forward control system of an attraction mechanism using a magnetic force) 531.

First Embodiment

Examples 1 to 4 will be described below as the first embodiment.

Example 1

Figure 1:
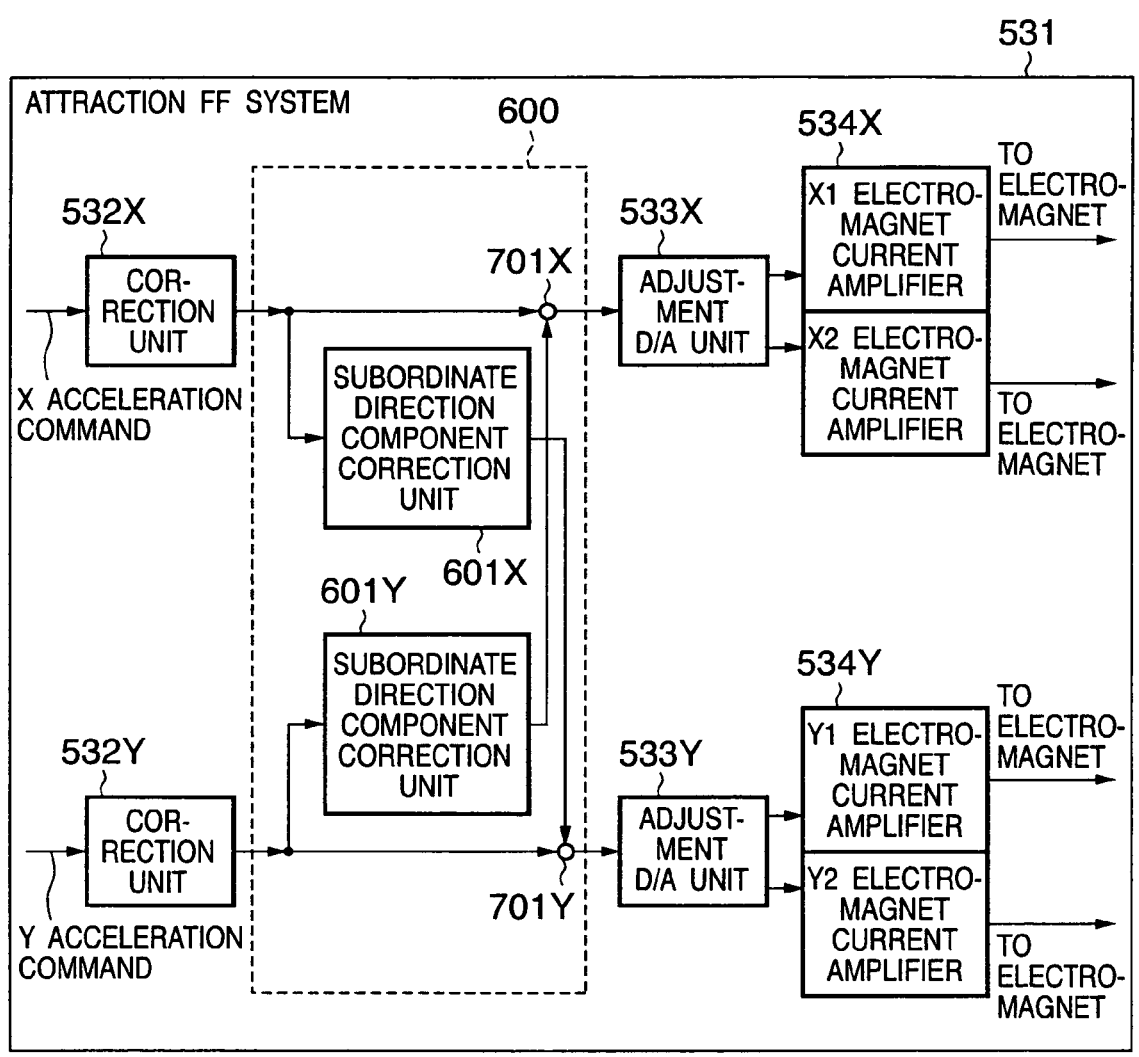
FIG. 1 is a block diagram of an attraction FF system, which incorporates a subordinate direction component reducing system according to Example 1 of the first embodiment.

FIG. 1 is a block diagram showing Example 1 of an attraction FF system 531, which incorporates a subordinate direction component reducing system. In FIG. 1, the arrangement, except for a subordinate direction component reducing system 600, is the same as the basic arrangement shown in FIG. 12. In this example, the subordinate direction component reducing system 600 includes an X-axis subordinate direction component correction unit 601X and a Y-axis subordinate direction component correction unit 601Y.

The subordinate direction component correction unit 601X calculates a correction amount on the basis of an X-axis acceleration command corrected by a correction unit 532X, and an adder 701Y adds the correction amount to a Y-axis acceleration command. Similarly, the subordinate direction component correction unit 601Y calculates a correction amount on the basis of the Y-axis acceleration command corrected by a correction unit 532Y, and an adder 701X adds the correction amount to the X-axis acceleration command.

The subordinate direction component correction units 601X and 601Y only need to multiply the acceleration commands for the axes by appropriate coefficients. This makes it possible to effectively cancel a subordinate direction component with a simple arrangement when an interval between each of electromagnets 508 and a corresponding magnetic block 507 is non-uniform in the initial state or steady state due to an assembly error, or the like, or when the action axis of the electromagnet 508 deviates from the barycenter of a top plate structure (a structure including a wafer top plate and a member which moves together with it). Coefficients set for the subordinate direction component correction units 601X and 601Y can be determined by driving the electromagnets 508 for driving the electromagnets for the axes in the initial state or steady state and at the same time measuring forces in other axial directions.

Example 2

Figure 2:
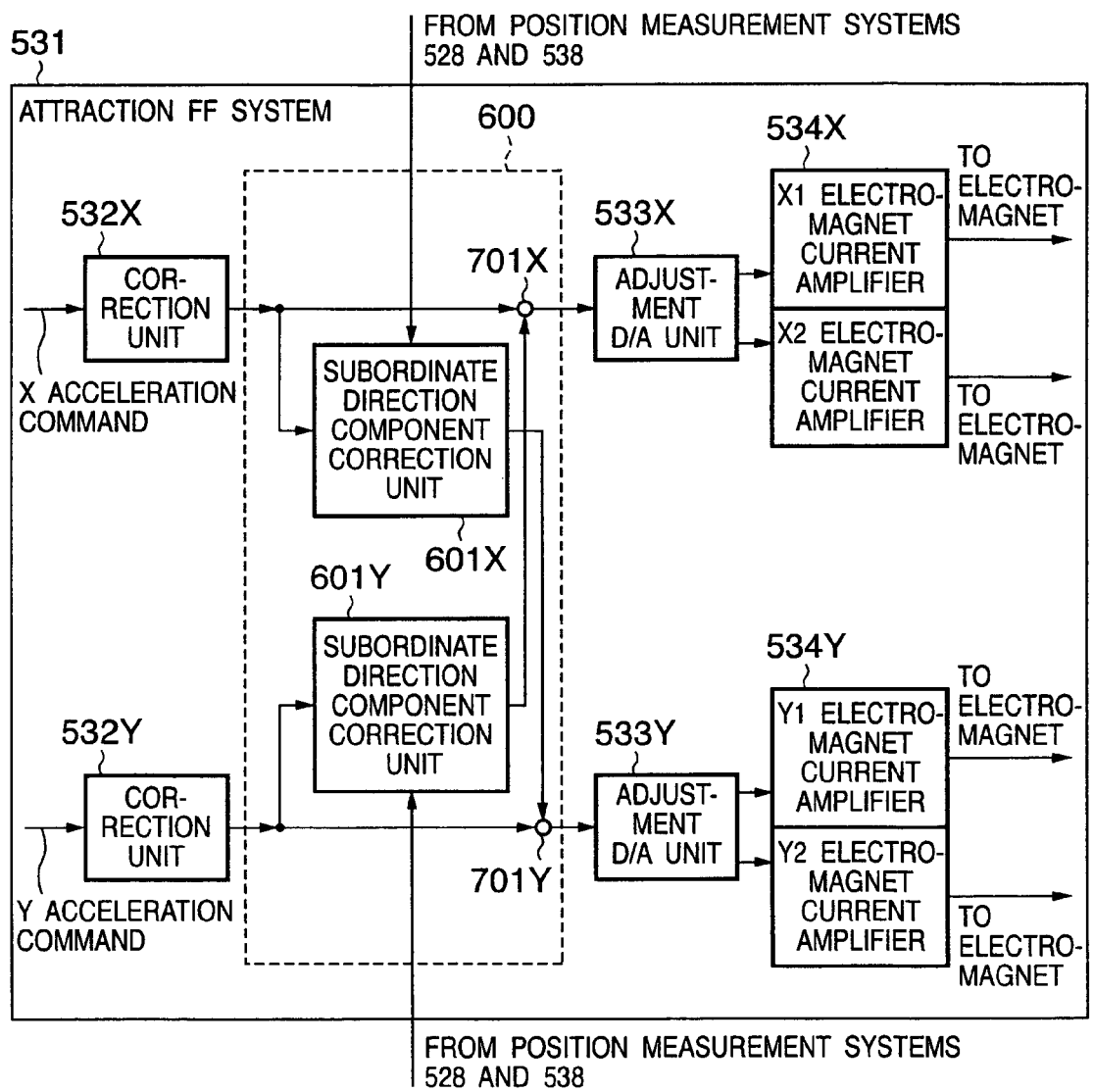
FIG. 2 is a block diagram of an attraction FF system, which incorporates a subordinate direction component reducing system according to Example 2 of the first embodiment.

FIG. 2 is a block diagram showing Example 2 of an attraction FF system 531, which incorporates a subordinate direction component reducing system. In this example, information on the position and/or posture of a wafer top plate 501 and/or X stage 561 measured by wafer top plate position measurement systems 528 and/or stage position measurement units 538 is provided to subordinate direction component correction units 601X and 601Y. With the use of this position information by the subordinate direction component correction units 601X and 601Y, even if an interval between each of electromagnets 508 and a corresponding magnetic block 507 varies due to a position fluctuation and/or posture fluctuation, acceleration/deceleration, or the like, of the wafer top plate 501 and/or X stage 561, a subordinate direction component can be corrected at a high precision.

In this case, a relationship between the interval between the electromagnet 508 and the magnetic block 507 and a correction coefficient must be calculated in advance. An attraction force is inversely proportional to the square of the interval between the electromagnet 508 and the corresponding magnetic body 507 and is proportional to the square of a current supplied to the electromagnet 508. For this reason, the correction coefficient is typically associated with the interval between the electromagnet 508 and the magnetic body 507 by a linear function.

Example 3

Figure 3:
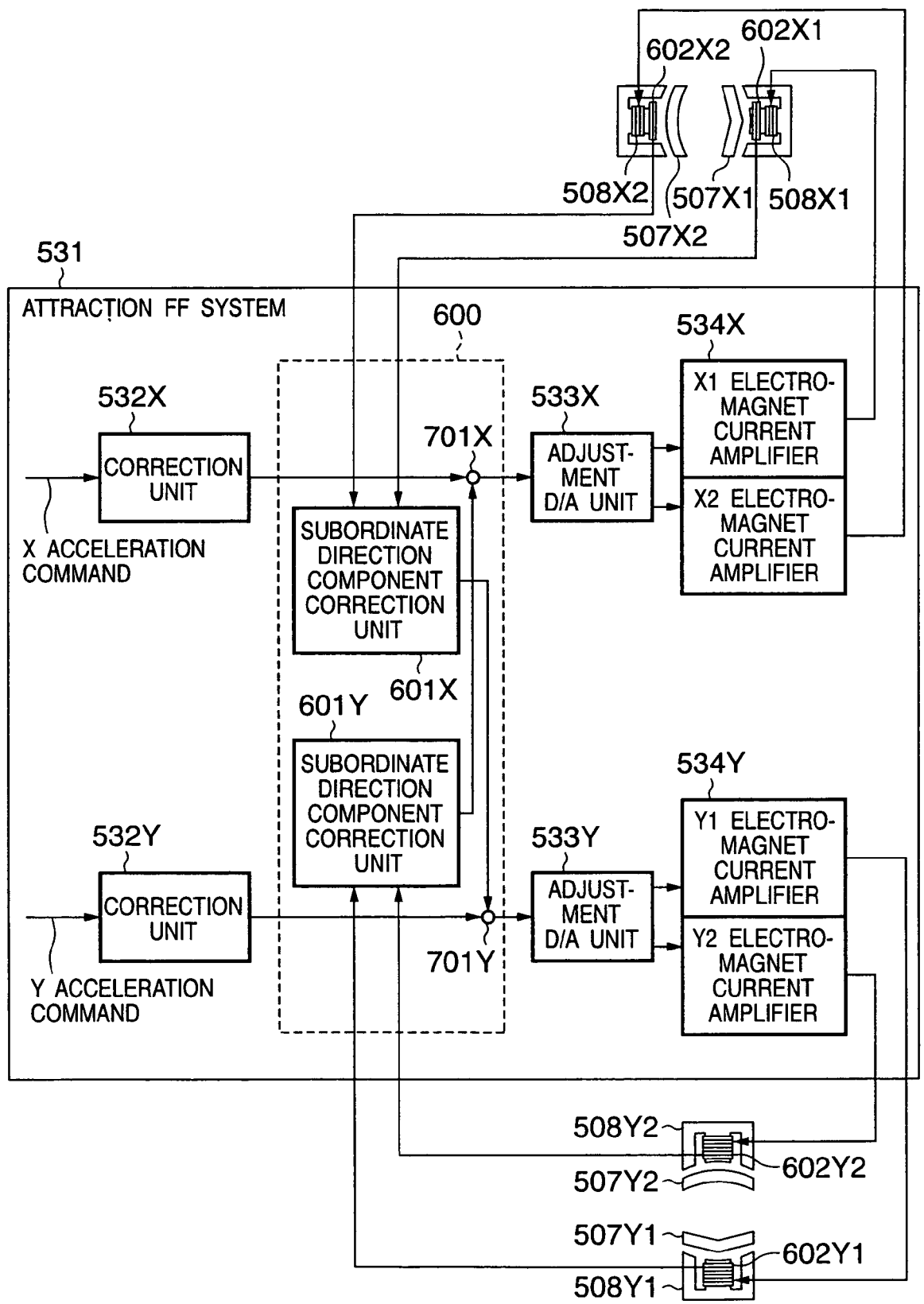
FIG. 3 is a block diagram of an attraction FF system, which incorporates a subordinate direction component reducing system according to Example 3 of the first embodiment.

FIG. 3 is a block diagram showing Example 3 of an attraction FF system 531, which incorporates a subordinate direction component reducing system. In this example, subordinate direction component correction units 601X and 601Y utilize magnetic flux values, which are obtained by magnetic flux measurement units (magnetic flux detection units) 602 (602X1, 602X2, 602Y1, and 602Y2), such as search coils arranged for electromagnets 508 (508X1, 508X2, 508Y1, and 508Y2), instead of acceleration commands corrected by correction units 532X and 532Y. This example can measure an attraction force actually generated by each electromagnet 508 and can perform more precise correction. An attraction force is proportional to the square of a magnetic flux, and a magnetic flux to be generated is proportional to a current. Hence, an operation using a linear function is preferably performed to obtain a current command.

Example 4

Figure 4:
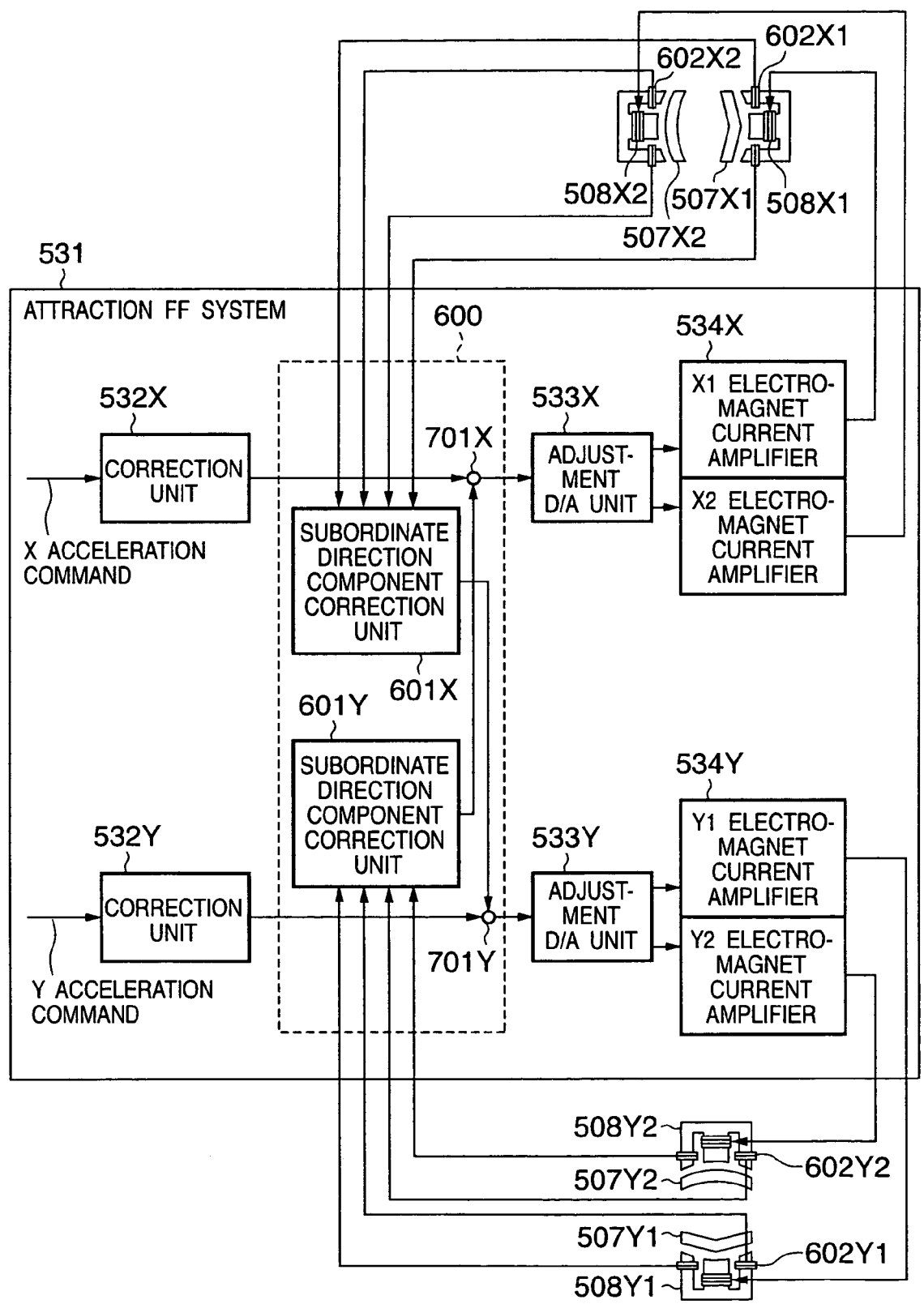
FIG. 4 is a block diagram of an attraction FF system, which incorporates a subordinate direction component reducing system according to Example 4 of the first embodiment.

FIG. 4 is a block diagram showing Example 4 of an attraction FF system 531, which incorporates a subordinate direction component reducing system. This example is a modification of Example 3, and a plurality of magnetic flux measurement units (magnetic flux detection units) are provided for one unit (one electromagnet 508 and one magnetic block 507). According to this example, if subordinate direction component correction units 601X and 601Y compare outputs from the plurality of magnetic flux measurement units, the non-uniformity of magnetic fluxes or attraction forces can be obtained. This makes it possible to directly calculate a subordinate direction component of an attraction force and perform more precise correction. In this example, if search coils are provided at both ends of an E-sectional magnetic body 585, an X-direction unit (a unit made up of an electromagnet 508X and a magnetic block 507X), can measure a subordinate direction component in the Y direction, while a Y-direction unit (a unit made up of an electromagnet 508Y and a magnetic block 507Y) can measure a subordinate direction component in the X direction.

As shown in FIG. 11, and the like, a stage arrangement of this embodiment has units which generate attraction forces only in the X and Y directions. The stage arrangement cannot compensate for components in other directions, such as the Z direction and rotational direction. If units which generate attraction forces in these directions are provided, compensation may be made for components in these directions. As for a magnetic flux measurement unit, if further magnetic flux measurement units are provided for one unit, subordinate direction components in various directions can be measured.

As described above, a subordinate direction component in a direction other than the driving directions generated by a driving unit made up of an electromagnet and a magnetic body is canceled using a driving unit other than the above-mentioned driving unit. With this operation, vibration or displacement of a stage, such as a wafer top plate, or the like, due to a subordinate direction component can be suppressed. Also, the alignment time can be shortened, and the alignment control characteristics can be improved.

When correction is not performed, the action axis of an actuator and the barycenter of a top plate structure (stage) must be made to strictly coincide with each other or the assembly precision must be increased so as to make uniform an interval between each electromagnet and a corresponding magnetic body, in order to improve the alignment precision and shorten the alignment time. Correction can maintain the alignment precision and alignment time even if the above-mentioned constraints are relaxed.

Second Embodiment

Examples 1 to 4 will be described below as the second embodiment.

Example 1

Figure 5:
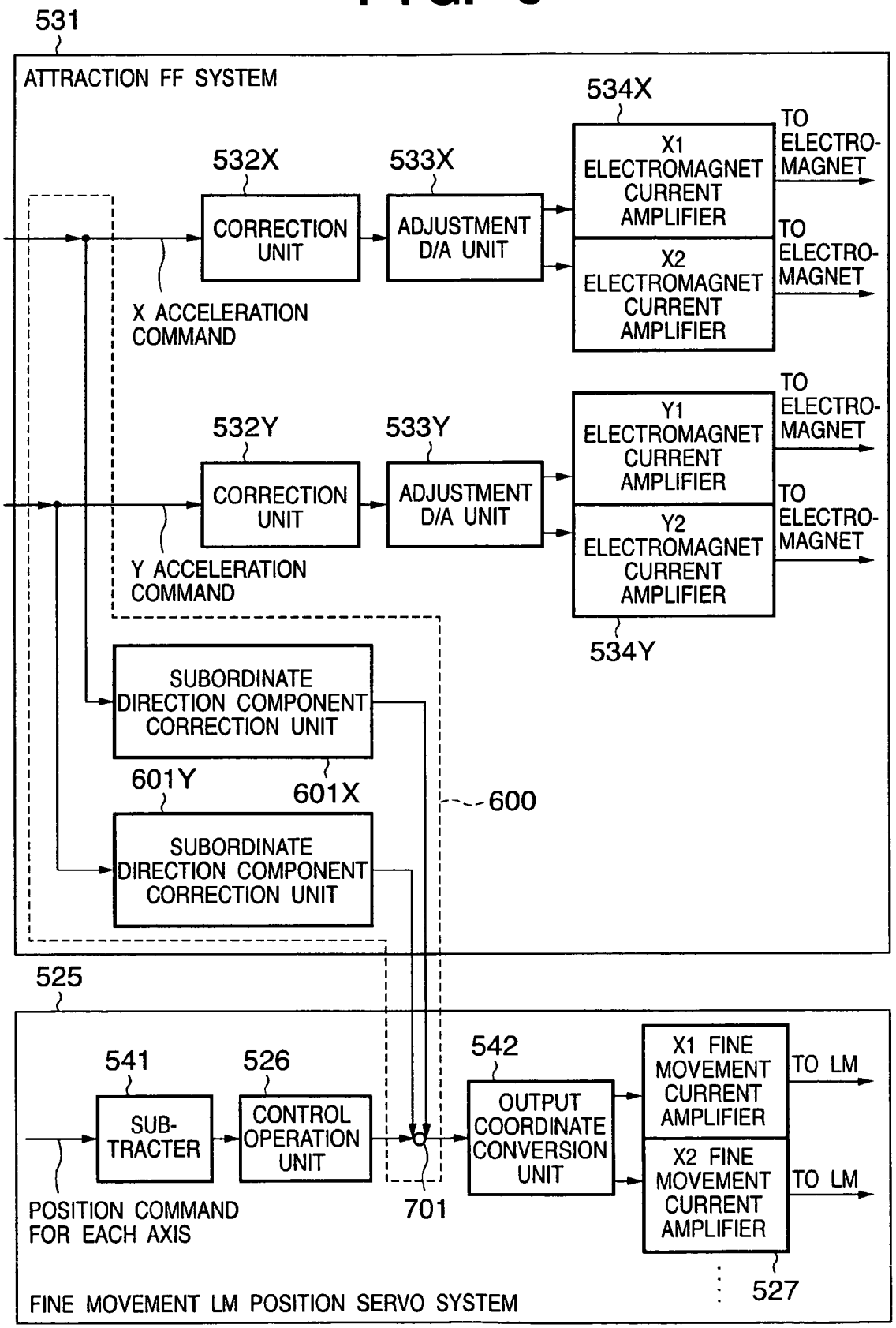
FIG. 5 is a block diagram of an attraction FF system, which incorporates a subordinate direction component reducing system according to Example 1 of the second embodiment.

FIG. 5 is a block diagram showing Example 1 of an attraction FF system 531, which incorporates a subordinate direction component reducing system.

A subordinate direction component correction unit 601X calculates a correction amount on the basis of an X-axis acceleration command before correction by a correction unit 532X, and an adder 701 of a fine movement LM position servo system 525 adds the correction amount to commands for fine movement linear motors. Similarly, a subordinate direction component correction unit 601Y calculates a correction amount on the basis of a Y-axis acceleration command before correction by a correction unit 532Y, and the adder 701 of the fine movement LM position servo system 525 adds the correction amount to commands for fine movement linear motors.

A force generated by a linear motor is proportional to a current, unlike an electromagnet. Since the acceleration commands before correction are used, the subordinate direction component correction units 601X and 601Y only need to multiply the acceleration commands for the axes by appropriate coefficients, as in the first embodiment. This makes it possible to effectively cancel a subordinate direction component with a simple arrangement when an interval between each of electromagnets 508 and a corresponding magnetic block 507 is non-uniform in the initial state or steady state due to an assembly error, or the like, or when the action axis of the electromagnet 508 deviates from the barycenter of a top plate structure. Coefficients set for the subordinate direction component correction units 601X and 601Y can be determined by driving the electromagnets 508 of the units (each of which is made up of the electromagnet 508 and the magnetic block 507) in the initial state or steady state and at the same time measuring forces in other axial directions.

Example 2

Figure 6:
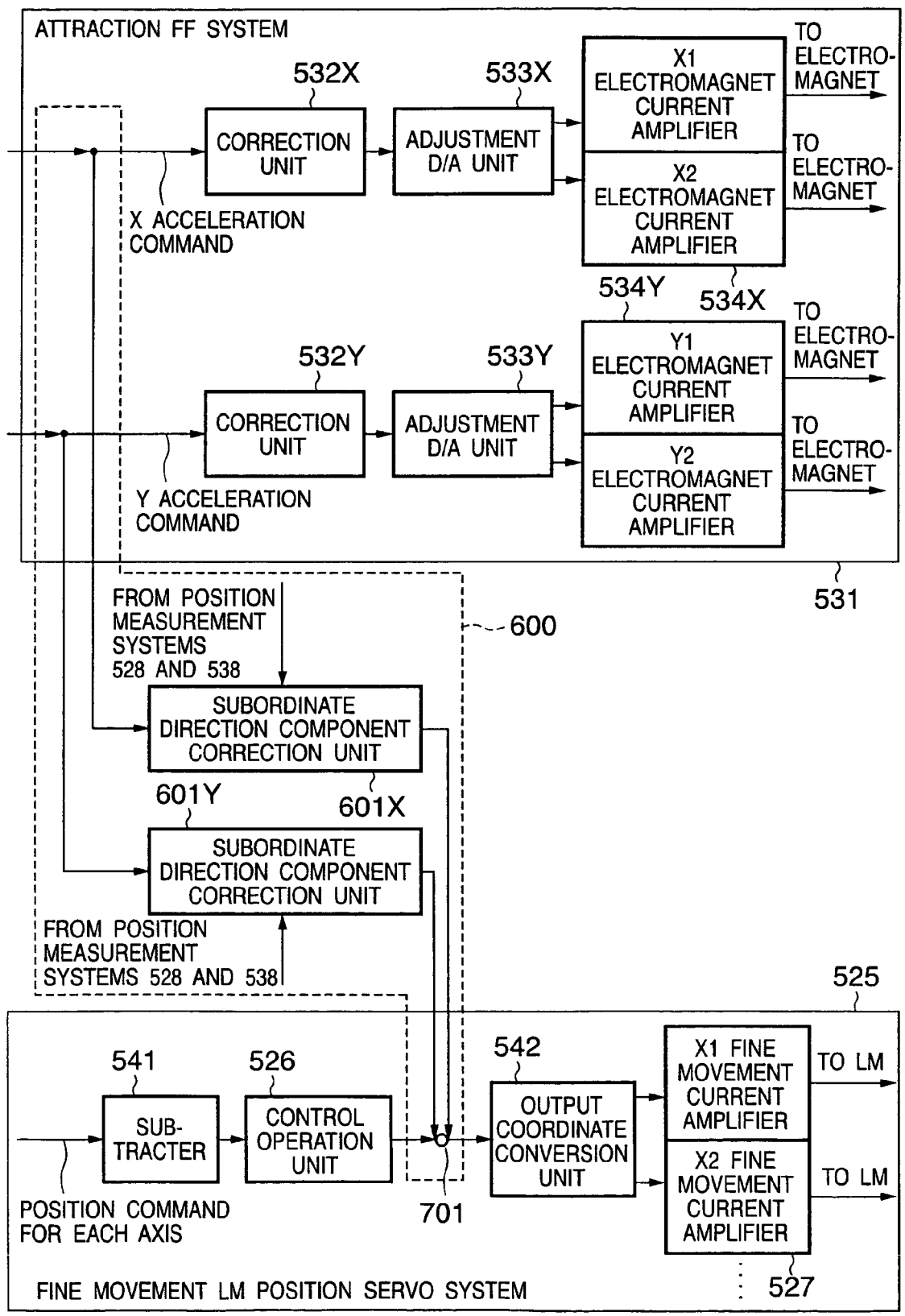
FIG. 6 is a block diagram of an attraction FF system, which incorporates a subordinate direction component reducing system according to Example 2 of the second embodiment.

FIG. 6 is a block diagram showing Example 2 of an attraction FF system 531, which incorporates a subordinate direction component reducing system. In this example, the position information and/or posture information of a wafer top plate 501 and/or X stage 561 measured by wafer top plate position measurement systems 528 and/or stage position measurement units 538 is provided to subordinate direction component correction units 601X and 601Y. With the use of this position information by the subordinate direction component correction units 601X and 601Y, even if an interval between each of electromagnets 508 and a corresponding magnetic block 507 varies due to a position fluctuation and/or posture fluctuation, acceleration/deceleration, or the like, of the wafer top plate 501 and/or X stage 561, a subordinate direction component can be corrected at high precision.

In this case, a relationship between the interval between the electromagnet and the magnetic block 507 and a correction coefficient must be calculated in advance. An attraction force is inversely proportional to the square of the interval between the electromagnet 508 and the corresponding magnetic body 507, and a force generated by a linear motor is proportional to a supplied current. For this reason, the correction coefficient is typically associated with the interval between the electromagnet 508 and the magnetic body 507 by a quadratic function.

Example 3

Figure 7:
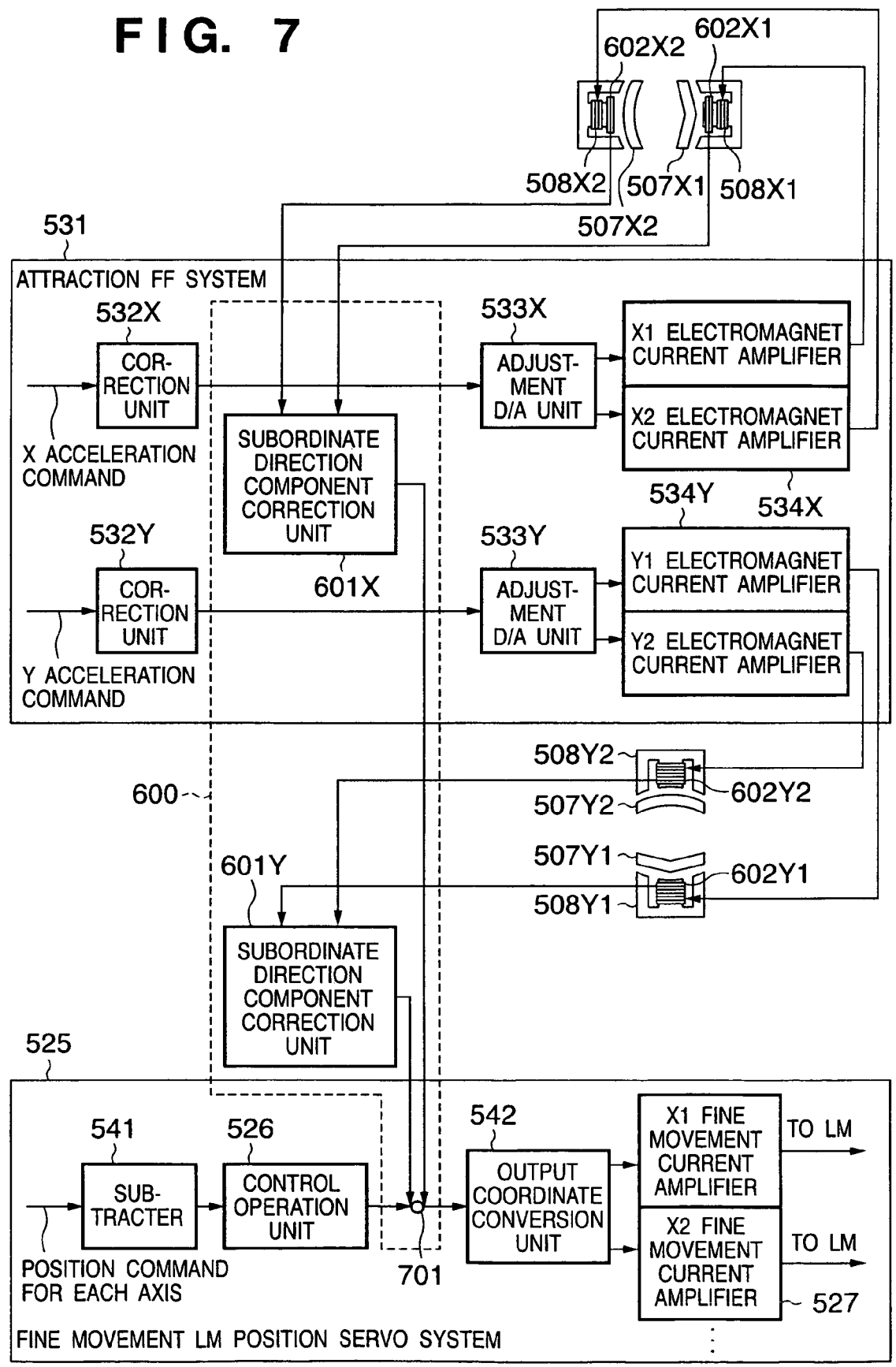
FIG. 7 is a block diagram of an attraction FF system, which incorporates a subordinate direction component reducing system according to Example 3 of the second embodiment.

FIG. 7 is a block diagram showing Example 3 of an attraction FF system 531, which incorporates a subordinate direction component reducing system. In this example, subordinate direction component correction units 601X and 601Y utilize magnetic flux values, which are obtained by magnetic flux measurement units 602 (602X1, 602X2, 602Y1, and 602Y2), such as search coils arranged for electromagnets 508 (508X1, 508X2, 508Y1, and 508Y2), instead of acceleration commands corrected by correction units 532X and 532Y. This example can measure an attraction force actually generated by each electromagnet 508 and can perform more precise correction. Since an attraction force is proportional to the square of a magnetic flux, operation using a quadratic function is required to obtain a current command from the magnetic flux.

Example 4

Figure 8:
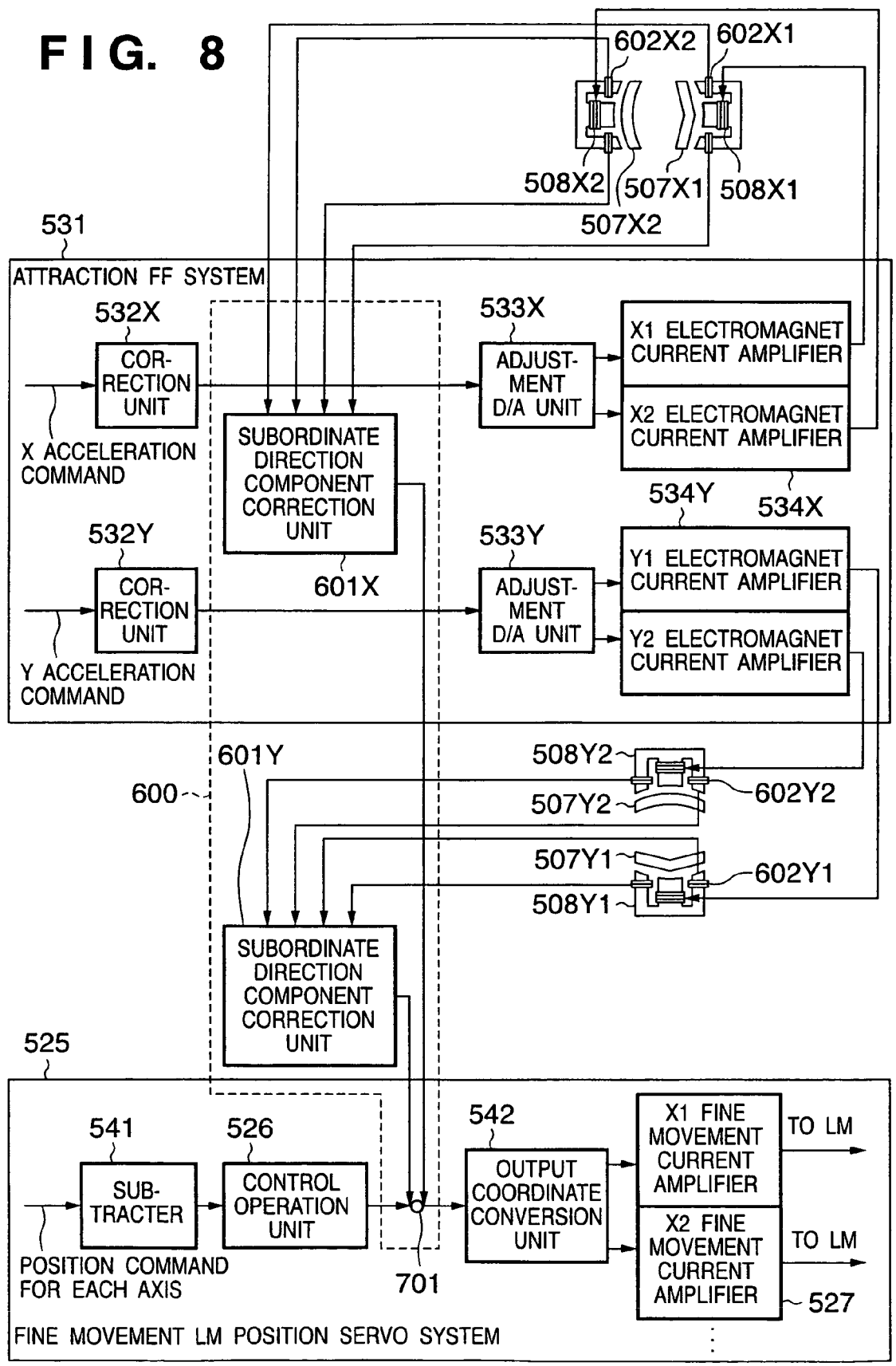
FIG. 8 is a block diagram of an attraction FF system, which incorporates a subordinate direction component reducing system according to Example 4 of the second embodiment.

FIG. 8 is a block diagram showing Example 4 of an attraction FF system 531, which incorporates a subordinate direction component reducing system. This example is a modification of Example 3, and a plurality of magnetic flux measurement units are provided for one unit (one electromagnet 508 and one magnetic block 507). According to this example, if subordinate direction component correction units 601X and 601Y compare outputs from the plurality of magnetic flux measurement units, the non-uniformity of magnetic fluxes or attraction forces can be obtained. This makes it possible to directly calculate a subordinate direction component of an attraction force and perform more precise correction. In this example, if search coils are provided at both ends of an E-sectional magnetic body 585, an X-direction unit (a unit made up of an electromagnet 508X and a magnetic block 507X) can measure a subordinate direction component in the Y direction while a Y-direction unit (a unit made up of an electromagnet 508Y and a magnetic block 507Y) can measure a subordinate direction component in the X direction.

As shown in FIG. 11, and the like, a stage arrangement of this embodiment has units which generate attraction forces only in the X and Y directions. With the use of linear motors 503 (each of which is made up of a stator 504 and movable element 505), the stage arrangement can compensate for a component in directions other than the X and Y directions, such as the Z direction and rotational direction. As for a magnetic flux measurement unit, if further magnetic flux measurement units are provided for one unit, subordinate direction components in various directions can be measured.

As described above, a subordinate direction component in a direction other than the driving directions generated by a driving unit having an electromagnet and a magnetic body is canceled using a linear motor different from the driving unit. With this operation, vibration or displacement of a stage such as a wafer top plate, or the like, due to a subordinate direction component can be suppressed. Also, the alignment time can be shortened, and the alignment control characteristics can be improved.

When correction is not performed, the action axis of an actuator and the barycenter of a top plate structure (stage) must be made to strictly coincide with each other or the assembly precision must be increased so as to make uniform an interval between each electromagnet and a corresponding magnetic body, in order to improve the alignment precision and shorten the alignment time. Correction can maintain the alignment precision and alignment time even if the above-mentioned constraints are relaxed.

Third Embodiment

Subordinate direction component correction described as the first embodiment and that using a linear motor described as the second embodiment may be combined. An electromagnet generates a larger force than a linear motor for the same current value, and can produce a larger correction effect with a smaller current and less heat generation. However, the electromagnet generates a nonlinear force for current, and it is difficult to perform high-precision correction. On the other hand, the linear motor generates a smaller force, but can perform linear and high-precision correction. Under the circumstances, with a combination of an electromagnet, which can generate a relatively large force and a linear motor, which can perform position control at relatively high precision, high-precision correction can be performed with low power consumption and less heat generation.

The end face shapes of electromagnets and magnetic bodies are not limited to cylindrical ones. Various shapes, such as a planar shape, a shape including a spherical portion, and the like, can cause non-uniformity of intervals and a deviation of the line of action of an attraction force from the barycenter. Hence, similar correction is effective for these shapes.

As has been described above, according to the above-mentioned embodiments, a force in a subordinate direction generated by the first actuator made up of an electromagnet and a magnetic body is canceled or reduced using the second actuator, which is made up of an electromagnet and a magnetic body and generates major attraction forces in directions different from that of the first actuator or another type of actuator, such as a linear motor. With this operation, displacement or posture fluctuation of a movable body, such as a stage, due to the force in the subordinate direction can be suppressed. Consequently, the alignment precision can be increased, and the alignment time can be shortened. Also, with this arrangement, constraints on the design of an alignment apparatus can be relaxed.

According to the present invention, a force which may act on a movable body in another direction when driving the movable body in the target direction can be reduced.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2003-133535, filed on May 12, 2003, which is hereby incorporated by reference herein.

What is claimed is:

1. An alignment apparatus which aligns a movable body, said apparatus comprising:
   a plurality of actuators which drive the movable body, wherein said plurality of actuators include a first actuator which drives the movable body in a first direction and a second actuator which drives the movable body in a second direction perpendicular to the first direction, said first actuator including an electromagnet, which comprises a magnetic block having an E-shaped cross section and a coil wound around a central tooth of the E-shaped magnetic block, and a magnetic body, and which drives the movable body in the first direction by an attraction force acting between the electromagnet and the magnetic body;
   a control system which controls said plurality of actuators; and
   a plurality of magnetic flux detection units, wherein said plurality of magnetic flux detection units are positioned at teeth on both sides of the E-shaped magnetic block so as to allow said control system to obtain non-uniformity of the attraction force acting between the electromagnet and the magnetic body due to non-uniform intervals between the electromagnet and the magnetic body,
   wherein said control system compares outputs of said plurality of magnetic flux detection units to obtain the non-uniformity, and controls the second actuator based on a result of the comparison, so as to reduce a force in the second direction acting on the movable body when the first actuator drives the movable body in the first direction.

2. An exposure apparatus comprising:
   (a) a substrate stage; and
   (b) a projection system which projects a pattern onto a substrate on said substrate stage,
   wherein said substrate stage has an alignment apparatus which aligns a movable body, the alignment apparatus including:
      (i) a plurality of actuators which drive the movable body, the said plurality of actuators including a first actuator which drives the movable body in a first direction and a second actuator which drives the movable body in a second direction perpendicular to the first direction, the first actuator including an electromagnet, which comprises a magnetic block having an E-shaped cross section and a coil wound around a central tooth of the E-shaped magnetic block, and a magnetic body, and which drives the movable body in the first direction by an attraction force acting between the electromagnet and the magnetic body,
      (ii) a control system which controls said plurality of actuators; and
      (iii) a plurality of magnetic flux detection units, wherein the said plurality of magnetic flux detection units are positioned at teeth on both sides of the E-shaped magnetic block so as to allow the control system to obtain non-uniformity of the attraction force acting between the electromagnet and the magnetic body due to non-uniform intervals between the electromagnet and the magnetic body, wherein said control system compares outputs of said plurality of magnetic flux detection units to obtain the non-uniformity, and controls the second actuator based on a result of the comparison, so as to reduce a force in the second direction acting on the movable body when the first actuator drives the movable body in the first direction.

3. A method of manufacturing a device, the method comprising:
  (a) applying a photosensitive agent to a substrate;
  (b) transferring a pattern or drawing a pattern on the substrate using an exposure apparatus; and
  (c) developing the transferred or drawn pattern on the substrate, wherein the exposure apparatus includes a substrate stage and a projection system which projects a pattern onto a substrate on the substrate stage, and the substrate stage has an alignment apparatus which aligns a movable body, the alignment apparatus including:
  (i) a plurality of actuators which drive the movable body, the plurality of actuators including a first actuator which drives the movable body in a first direction and a second actuator which drives the movable body in a second direction perpendicular to the first direction, the first actuator including an electromagnet, which comprises a magnetic block having an E-shaped cross section and a coil wound around a central tooth of the E-shaped magnetic block, and a magnetic body, and which drives the movable body in the first direction by an attraction force acting between the electromagnet and the magnetic body;
  (ii) a control system which controls the plurality of actuators; and
  (iii) a plurality of magnetic flux detection units, the plurality of magnetic flux detection units being positioned at teeth on both sides of the E-shaped magnetic block so as to allow the control system to obtain non-uniformity of the attraction force acting between the electromagnet and the magnetic body due to non-uniform intervals between the electromagnet and the magnetic body, wherein the control system compares the outputs of the plurality of magnetic flux detection units to obtain the non-uniformity, and controls the second actuator based on a result of the comparison, so as to reduce a force in the second direction acting on the movable body when the first actuator drives the movable body in the first direction.

* * * * *